United States Patent
Rachid et al.

(10) Patent No.: US 9,712,179 B2
(45) Date of Patent: Jul. 18, 2017

(54) METHOD AND SYSTEM FOR BROADBAND ANALOG TO DIGITAL CONVERTER TECHNOLOGY

(71) Applicant: MaxLinear, Inc., Carlsbad, CA (US)

(72) Inventors: Mansour Rachid, Los Angeles, CA (US); Timothy Gallagher, Encinitas, CA (US); Curtis Ling, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 15/012,313

(22) Filed: Feb. 1, 2016

(65) Prior Publication Data

US 2016/0173117 A1    Jun. 16, 2016

Related U.S. Application Data

(63) Continuation of application No. 14/746,314, filed on Jun. 22, 2015, now Pat. No. 9,252,798, which is a
(Continued)

(51) Int. Cl.
*H03M 1/10* (2006.01)
*H03M 1/12* (2006.01)

(52) U.S. Cl.
CPC .......... *H03M 1/1038* (2013.01); *H03M 1/12* (2013.01)

(58) Field of Classification Search
CPC ......... H03M 1/1038; H03M 1/12; H03M 3/38
(Continued)

(56) References Cited

U.S. PATENT DOCUMENTS 5,832,030 A * 11/1998 Tzannes ............. H04L 27/2604
370/480
5,838,272 A    11/1998 Steiner et al.
(Continued)

FOREIGN PATENT DOCUMENTS

CN        1156122 C    6/2004
TW         457781 B    10/2001
(Continued)

OTHER PUBLICATIONS

Int'l Search Report and Written Opinion for PCT/US2013/020080 dated Mar. 19, 2013.
(Continued)

*Primary Examiner* — Jean B Jeanglaude
(74) *Attorney, Agent, or Firm* — McAndrews, Held & Malloy, Ltd.

(57) ABSTRACT

Methods and systems are provided for reconstructing bands in received signals. A first band in a received multiband signal may be reconstructed, during processing of the multiband signal, when the first band is self-aliased during sampling of a second band. The reconstructing may comprise generating a plurality of components corresponding to the first band, based on the sampling of the second band, and combining the plurality of components to reconstruct the first band. Generating a first component may comprise applying high-pass filtering and/or decimation to an input corresponding to an output of the sampling of the second band. Generating a second component may comprise applying low-pass filtering and/or re-sampling to an input corresponding to an output of the sampling of the second band. An adjustment may be applied, when generating the second component, based on sampling of the first band. The adjustment may comprise a subtraction from sampling output.

20 Claims, 12 Drawing Sheets

Related U.S. Application Data continuation of application No. 14/087,710, filed on Nov. 22, 2013, now Pat. No. 9,094,036, which is a continuation of application No. 13/345,063, filed on Jan. 6, 2012, now Pat. No. 8,599,050.

(58) Field of Classification Search
USPC ......... 341/118–120, 155, 156; 375/350, 285; 455/67.11
See application file for complete search history.

(56) References Cited

U.S. PATENT DOCUMENTS

| | | | |
|---|---|---|---|
| 6,169,723 B1* | 1/2001 | Fertner | G06F 17/142 |
| | | | 324/76.21 |
| 6,400,781 B1* | 6/2002 | Vandendorpe | H04L 25/03159 |
| | | | 375/350 |
| 6,600,438 B2 | 7/2003 | Hilton | |
| 6,636,722 B1 | 10/2003 | Dalebroux et al. | |
| 7,242,725 B2 | 7/2007 | Matsumoto et al. | |
| 7,602,323 B2 | 10/2009 | Galton et al. | |
| 7,688,235 B2 | 3/2010 | Batruni | |
| 2002/0048319 A1* | 4/2002 | Onno | G06T 9/00 |
| | | | 375/240 |
| 2003/0080890 A1 | 5/2003 | Hilton | |
| 2004/0196921 A1 | 10/2004 | Matsumoto et al. | |
| 2006/0092058 A1 | 5/2006 | Slavin | |
| 2007/0085719 A1 | 4/2007 | Maxim et al. | |
| 2007/0131078 A1 | 6/2007 | Kokkeler | |
| 2008/0150773 A1 | 6/2008 | Arais et al. | |
| 2008/0165040 A1 | 7/2008 | Rotchford et al. | |
| 2008/0258949 A1 | 10/2008 | Galton et al. | |
| 2008/0291066 A1 | 11/2008 | Batruni | |
| 2010/0097138 A1 | 4/2010 | Sorrells et al. | |
| 2011/0227768 A1 | 9/2011 | Kolze et al. | |
| 2011/0294453 A1* | 12/2011 | Mishali | H04B 1/0092 |
| | | | 455/293 |

FOREIGN PATENT DOCUMENTS

| | | |
|---|---|---|
| TW | 200840250 A | 10/2008 |
| TW | 201141073 A | 11/2011 |

OTHER PUBLICATIONS

Stockwell et al, "Localization of the Complex Spectrum: The S Transform," IEEE Transactions on Signal Processing, vol. 44, No. 4, Apr. 1996 [online] [retrieved on Mar. 1, 2013 (Mar. 1, 2013)] Retrieved from the Internet <URL: https://bitbucket.org/cleemesser/stockwelltransform/src/41127bbfa456/ref/StockwellRG1996-Localization%20of%20the%20complex%20spectrum%20the%20S-transform-IEEETransSigProc.pdf> Section IV, para 1-2.

Taiwanese Office Action, dated Aug. 24, 2016, for TW102100362. (7 pages).

* cited by examiner

METHOD AND SYSTEM FOR BROADBAND ANALOG TO DIGITAL CONVERTER TECHNOLOGY

CLAIM OF PRIORITY

This application is a continuation of U.S. patent application Ser. No. 14/746,314, filed Jun. 22, 2015, which is a continuation of U.S. patent application Ser. No. 14/087,710, filed Nov. 22, 2013, which in turn is a continuation of U.S. patent application Ser. No. 13/345,063 filed on Jan. 6, 2012. Each of the above identified application is hereby incorporated herein by reference in its entirety.

CROSS-REFERENCE TO RELATED APPLICATIONS/INCORPORATION BY REFERENCE

[Not Applicable].

FEDERALLY SPONSORED RESEARCH OR DEVELOPMENT

[Not Applicable].

MICROFICHE/COPYRIGHT REFERENCE

[Not Applicable].

FIELD OF THE INVENTION

Certain embodiments of the invention relate to signal processing. More specifically, certain embodiments of the invention relate to a method and system for broadband signal acquisition and analog to digital conversion technology.

BACKGROUND OF THE INVENTION

Information, including content communicated over broadband connection, is typically carried using analog signals transmitted over wireless and/or wired connections. Therefore, extracting broadband information requires performing analog-to-digital conversion at the receiving end. Reception of analog signals, and analog-to-digital conversion performed thereon, however, may introduce errors and/or distortion. The error and/or distortion may be causes by nonlinearity exhibited by receiving system, and/or by various components thereof that are utilized during reception, handling and/or conversion of analog signals into their corresponding discrete counterparts.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for broadband signal acquisition and analog to digital conversion technology, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Figure 1:
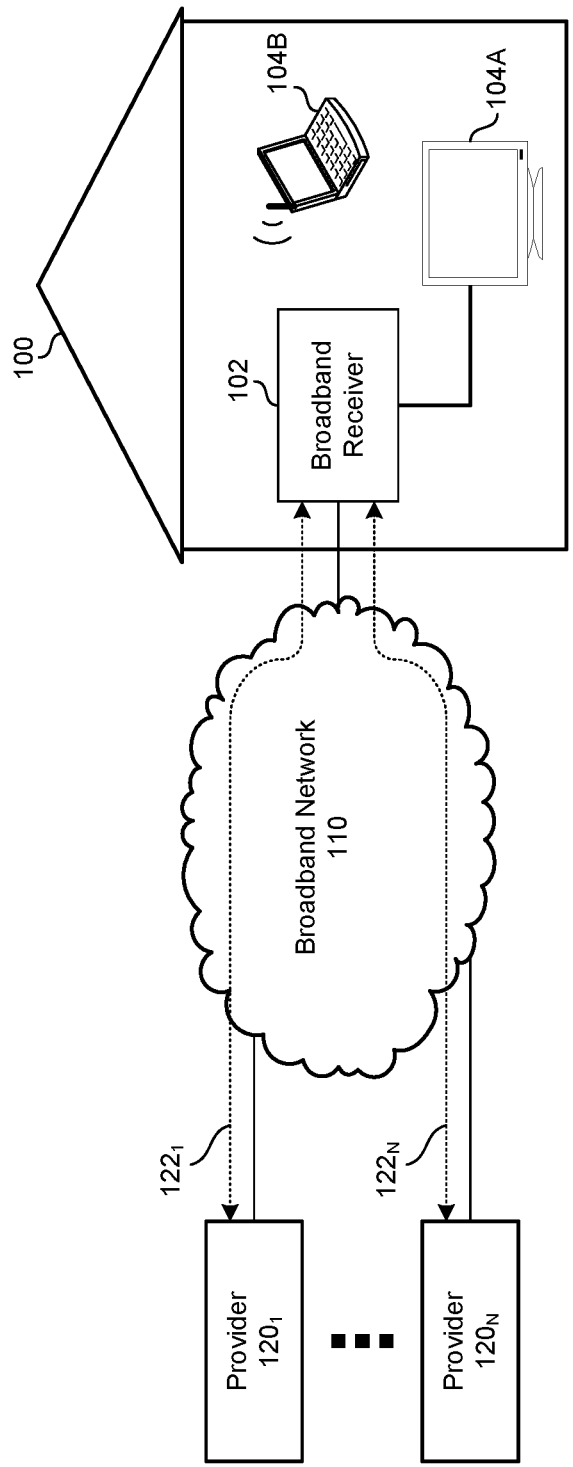
FIG. 1 is a block diagram that illustrates an exemplary communication network that supports broadband connectivity, which may be utilized in connection with the invention.

Certain embodiments of the invention may be found in a method and system for broadband analog to digital converter technology. In various embodiments of the invention, a device that performs analog-to-digital conversions, may be configured to correct nonlinearity associated with reception of analog signals and analog-to-digital conversion of the received analog signals, based on a particular nonlinearity correction model. In particular, the device may be configured to calibrate the nonlinearity correction, and nonlinearity calibration may comprise generating and/or estimating correction parameters, which when applied via the particular nonlinearity correction model, to the total spectral content, may reduce distortion resulting from the system's nonlinearity in originally-unoccupied spectral regions. The device may then correct, using the applicable nonlinearity correction model and the estimated correction parameters, digital signals generated based on the sampling of the received analog signals. The device may be configured to perform the nonlinearity correction calibration during reception and handling of the analog signals. The correction estimation parameters may be generated and/or estimated based on signals in particular spectral regions. In this regard, the particular spectral regions may correspond to the originally-unoccupied spectral regions. The nonlinearity correction calibration may comprise injecting specific signals, such as training signals, in the particular spectral regions. The specific signals may have known characteristics (e.g., frequency, amplitude, phase, etc.). Accordingly, the generation and/or estimation of the correction estimation parameters may be based on the injected specific signals. The nonlinearity correction calibration may comprise isolating signals, or content located in the particular spectral regions, wherein the correction estimation parameters may be generated and/or estimation may be performed based on that isolation. The isolating of signals and/or content located in the particular spectral regions may be performed before, during, or after correcting the digital signals.

The device may also be configured to perform secondary subsampling, to enable acquiring a particular band of a multiband signal when the particular band is self-aliased during the sampling of another, primary band of the multiband signal. In this regard, acquiring the particular band during the secondary subsampling may comprise generating a plurality of components corresponding to the particular band based on sampling of the particular band and sampling of the primary band, and combining the plurality of components to reconstruct the particular band. Use of secondary subsampling may be optional, with that function being disabled, for example, when sampling of the primary band is determined to not cause self-aliasing of the particular band. During the secondary subsampling, a first component of the particular band may be generated based on high-pass filtering and then decimating of an output of analog-to-digital conversion of the output of the sampling of the primary band. A second component may be generated by low-pass filtering and then re-sampling of the output of analog-to-digital conversion of the output of the sampling of the primary band; and then subtracting the low-pass filtered and re-sampled output from an output of analog-to-digital conversion of the output of the sampling of the particular band.

FIG. 1 is a block diagram that illustrates an exemplary communication network that supports broadband connectivity, in accordance with an embodiment of the invention. Referring to FIG. 1, there is shown a broadband receiver 102, local network devices 104A and 104B, broadband network 110, and a plurality of provider head-ends $120_1 \ldots 120_N$.

Each of the plurality of provider head-ends $120_1 \ldots 120_N$ may comprise equipment comprising suitable logic, circuitry, interfaces, and/or code operable to communicate multimedia and/or Internet content via connections $122_1 \ldots 122_N$, respectively, over backhaul links into the broadband network 110. Multimedia and/or Internet content may comprise voice, audio and/or visual content comprising, video, still images, animated images, graphics and/or textual content. The provider head-ends $120_1 \ldots 120_N$ may correspond to cable, Internet, and/or satellite broadcast head-ends. The connectivity between the provider head-ends $120_1 \ldots 120_N$ and the broadband network 110 may be provided, for example, via one or more optical, wired, and/or wireless links. The broadband network 110 may comprise one or more interconnecting networks for providing broadband connectivity to a plurality of network devices that are connected, directly or indirectly to broadband network 110. The broadband network 110 may comprise, for example, a satellite network, cable network, the Internet, and/or similar local or wide area networks, which are capable of forwarding data, which may comprise, but is not limited to Internet and/or multimedia data, at broadband speeds.

The broadband receiver 102 may be installed in a location 100 to enable connecting the location 100 to broadband network 110, providing, therefore, broadband connectivity to other devices in the location 100. The location 100 may correspond to a residence, a multi-tenant property, and/or a commercial or enterprise property. In this regard, the broadband receiver 102 may facilitate and/or manage distribution of multimedia content received, for example, from provider head-ends $120_1 \ldots 120_N$ via the broadband network 110. Accordingly, the broadband receiver 102 may comprise suitable logic, circuitry, interfaces, and/or code for enabling broadband communication via the broadband network 110. The broadband receiver 102 may also comprise suitable logic, circuitry, interfaces, and/or code to enable communicating with devices within the location 100, for example local network devices 104A and/or 104B, which may be associated with the broadband receiver 102 via a local network. The broadband receiver 102 may comprise a satellite receiver, cable receiver, a cable modem, or like devices. The broadband receiver 102 may be configured to support Multimedia over Coax Alliance (MoCA) connectivity.

The local network devices 104A and 104B may each comprise suitable logic, circuitry, interfaces, and/or code for enabling performing various functions, operations, and/or applications within the location 100. The local network devices 104A and 104B may be operable, for example, to generate, receive, process, and/or present multimedia content and may additionally be enabled to run a web browser or other applications for providing Internet services to users of the local network device 104A and/or 104B. In this regard, the local network devices 104A and 104B may be operable to communicate utilizing one or more wired and/or wireless standards. In an exemplary aspect of the invention, data received, handled, and/or transmitted by the local network device 104A and/or 104B may be communicated to and/or from the location 100 via broadband connections, using the broadband receiver 102. In this regard, each of the local network devices 104A and 104B may be operable to transmit and/or receive data via cellular, WiFi, and/or Fiber based links and/or connections to the broadband receiver 102. Exemplary local network devices may comprise televisions, personal computers (PC), laptop computers, mobile phones, and/or personal multimedia players.

In operation, the broadband receiver 102 may provide broadband connectivity in location 100. The broadband receiver 102 may be operable to, for example, process received Internet packets, communicated via the broadband network 110, which may comprise multimedia data. The broadband receiver 102 may store and/or forward received data to one or more of the local network devices 104A and 104B. After processing the received packets, to extract the multimedia content for example, the broadband receiver 102 may store and/or forward received data to one or more of the local network devices 104A and 104B. For security purposes, use of multimedia content communicated by the provider head-ends $120_1$ and $120_N$ may be restricted. For example, in instances where the provider head-ends $120_1$ and $120_N$ correspond to cable TV providers, use of restriction technologies may ensure that only subscribers may access the communication data, and that the use is further limited to a geographical location—e.g., a residence or an office. The broadband connections of the broadband receiver 102 may comprise wired connections (e.g., cable) and/or wireless (e.g., satellite), comprising physical layers (wired and/or wireless) in which analog carrier signals are utilized to carry the data communicated via these broadband connections. For example, in digital cable, satellite, and/or terrestrial TV broadcasts, the content (multimedia data corresponding to the TV channels) is transmitted in the form of digitally modulated signals that are delivered to the end users over analog carrier signals—though cable distribution networks and/or over the air.

Thus, when handling broadband connections, the broadband receiver 102 may be required to receive analog signals, and to perform analog-to-digital conversion thereof to extract the digital data carried therein. Analog-to-digital conversion, however, may introduce errors and/or distortion that may degrade the quality of the digital signals obtained from such conversion, such that the extracted digital signals may differ from the original digital signals transmitted by the source. One such type of errors is nonlinearity related errors, which may result from one or more components utilized during the analog-to-digital conversion having nonlinearity characteristics. Accordingly, in various embodiments of the invention, devices performing analog-to-digital conversion, such as broadband receiver 102 in the course of handling broadband connections, may be configured to correct nonlinearity errors and/or distortion.

Figure 2:
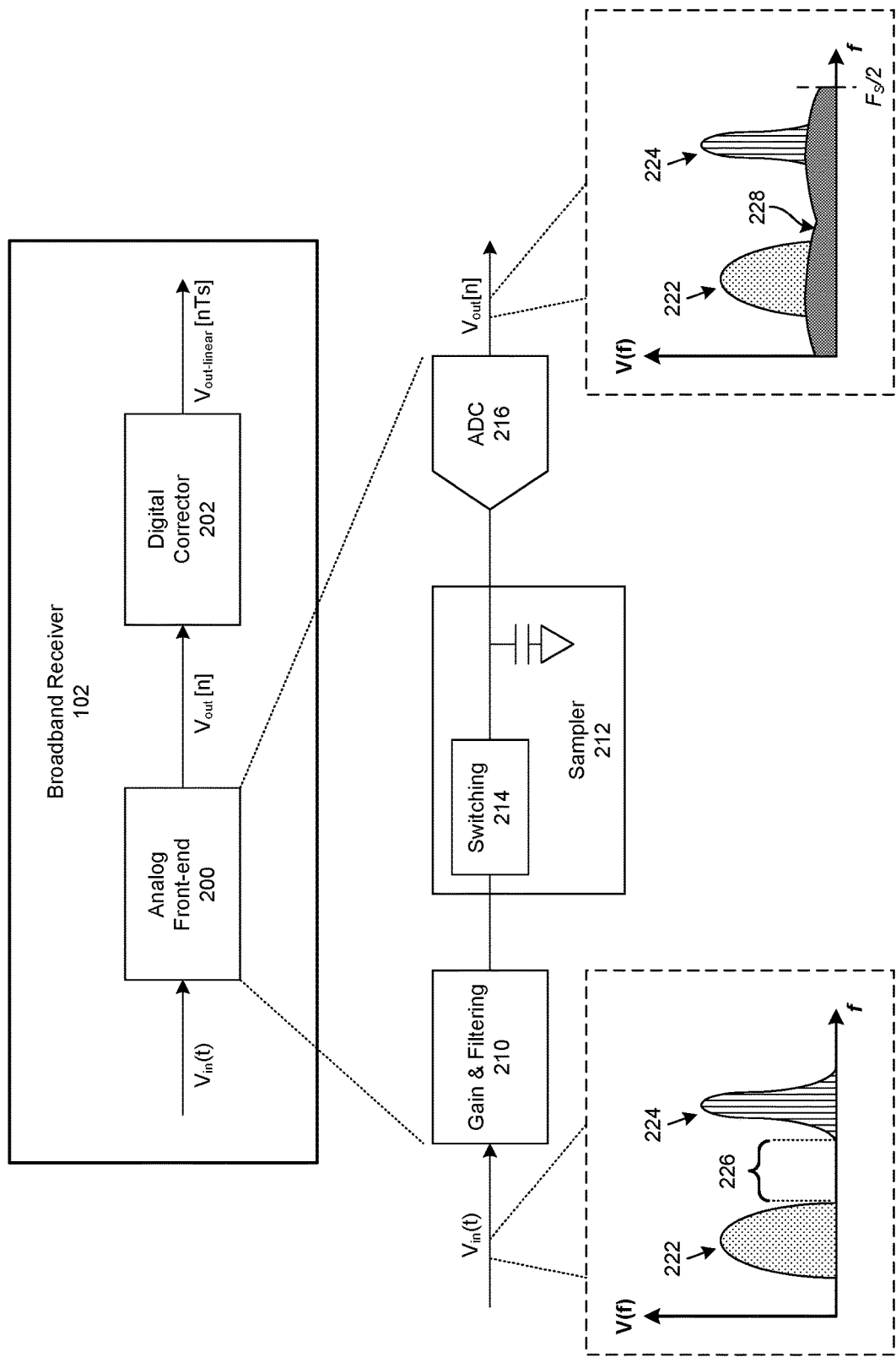
FIG. 2 is a block diagram that illustrates an exemplary broadband receiver, which may be utilized in connection with the invention.

FIG. 2 is a block diagram that illustrates an exemplary broadband receiver, which may be utilized in connection with the invention. Referring to FIG. 2, there is shown the broadband receiver 102 of FIG. 1. In particular, shown in FIG. 1 are certain components of the broadband receiver 102, namely an analog front-end 200 and a digital corrector 202.

The analog front-end 200 may comprise suitable logic, circuitry, interfaces, and/or code operable to handle the reception of analog signals carrying content processed via the broadband receiver 102. The analog front-end 200 may comprise, for example, a gain and filtering module 210, a sampler 212, and an analog-to-digital converter (ADC) 216. The gain and filtering module 210 may comprise suitable logic, circuitry, interfaces, and/or code operable to perform amplification, gain and filtering processing of analog signals, based on one or more particular criteria. The sampler 212 may comprise suitable logic, circuitry, interfaces, and/or code operable to sample analog signals, at particular sampling rate. In this regard, sampling may comprise reducing continuous analog signals to corresponding discrete signals. The sampler 212 may be operable to, for example, determine and/or generate a sequence of samples—that is discrete-time signals based on the received analog signals. This may be achieved by reading the value of the continuous input analog signal at certain, periodic intervals as determined by the sampling rate, while using the switching module 214 to switch off passing of the input analog signals in between the read points and holding the output constant when the input signal is switched off. The ADC 216 may comprise suitable logic, circuitry, interfaces, and/or code operable to convert analog signals into digital signals. In this regard, the ADC 216 may generate the digital signals based on the samples determined and/or generated by the sampler 212. In an exemplary aspect of the invention, the analog front-end 200 may exhibit nonlinear behavior, which may be static and/or dynamic, during reception of analog signals and/or handling thereof. In this regard, nonlinearity may be introduced because of the filtering and/or gain processing of the gain and filtering module 210, sampling operation of the sampler 212 and/or the switching module 214 thereof, and/or operation of the ADC 216.

The digital corrector 202 may comprise suitable logic, circuitry, interfaces, and/or code operable to correct errors and/or distortion introduced during reception and handling of analog signals. In an exemplary aspect of the invention, at least some of the errors and/or distortion corrected via the digital corrector 202 may be caused by nonlinearity in the system, specifically in the analog front-end 202. In this regard, the digital corrector 202 may implement and/or utilize a mathematical model to estimate or correct the nonlinear errors or distortion in the digital output generated based the received analog signal.

In operation, the analog front-end 200 may receive and process analog signals that carry digital content, such as during broadband communication. In this regard, the analog front-end 200 may be operable to perform gain and filtering processing of a received analog signal, which may be represented by the continuous voltage function $V_{in}(t)$, via the gain and filtering module 210; and may then sample the received analog signal via the sampler 212, at particular intervals, and perform analog-to-digital conversion based thereon via the ADC 216, to generate based on the input (received) analog signal a corresponding flow of voltage samples, which may represented by the voltage function $V_O[n]$. The analog front-end 200 may exhibit during reception and handling of the input analog signal $V_{in}(t)$, and/or sampling thereof—that is the generation of the corresponding sample flow $V_O[n]$, a nonlinear behavior, which may comprise static and/or dynamic nonlinearity characteristics. In this regard, the input-output relationship for dynamic nonlinearity exhibited by the analog front-end 200 may be described, at a sampling instance, by equation (1):

$$V_{in}(nT_S) \sim \sum_k \eta_k \times V_O^{p_k}(nT_S) \times \left(\frac{d^{u_k} V_O(nT_S)}{dt^{u_k}}\right)^{q_k} \times \left(\frac{d^{v_k} V_O(nT_S)}{dt^{v_k}}\right)^{r_k} \quad (1)$$

where p, q, and r∈[0,N], with N being the nonlinearity order; u and v∈[1,M], with M being the memory order; $T_S$ being the sampling period; and $\eta_k$ being the weight of the nonlinear term k.

Accordingly, the digital corrector 202 may be configured to implement a correction model intended to estimate or correct the nonlinear errors in the acquired samples. For example, where the nonlinearity exhibited by the analog front-end 200 corresponds to equation (1), the correction model implemented by the digital corrector may be based on the Volterra Series, such that the relationship between the resultant, linear digital signal $V_{out-linear}[n]$ and the generated, nonlinear samples function $V_O[n]$ may be described by equation (2):

$$\hat{V}_{in-linear}(nT_S) \sim \qquad (2)$$

$$\sum_k \mu_k \times V_O^{\alpha_k}[n - a_k/L] \times V_O^{\beta_k}[n - b_k/L] \times V_O^{\gamma_k}[n - c_k/L]$$

where $\alpha, \beta, \gamma \ldots \in [0,N]$, with N being the nonlinearity order; a, b, c $\ldots \in [0,M]$, with M being the memory order; $T_S$ being the sampling period; and $\mu_k$ being the weight of the nonlinear term k.

In various embodiments of the invention, nonlinearity models associated with a particular system, such as the model corresponding to the nonlinearity exhibited by the analog front-end 200, may be calibrated. In this regard, calibration of the nonlinearity model may comprise determining or estimating nonlinearity related parameters to enable performing nonlinearity related corrections—that is correcting nonlinearity related errors and/or distortion—based on these nonlinearity related parameters. For example, during nonlinearity calibration of the analog front-end 200, weights $\mu_i$ of the nonlinear model corresponding to the nonlinearity exhibited by the analog front-end 200, may be estimated to enable performing the correction expressed in equation (2). In this regard, several estimation methods may be utilized, such as least squares or least mean squared methods. The estimation may be performed based on particular signals. In this regard, the particular signals may comprise signals having known characteristics (e.g., frequency, amplitude and phase), and thus having predictable corresponding samples which may enable estimating nonlinearity related parameters (e.g. nonlinearity weights) based on analysis of variations in the actual, resultant samples compared to the predictable samples—i.e., the output having signal characteristics that are different.

In some embodiments of the invention, estimating the nonlinearity related parameters may be performed even without necessitating use of particular signals, and/or without having any knowledge of particular characteristics of any such signals. This may be done by focusing the estimation on particular regions in the frequency domain spectrum. In this regard, received (analog) signals may have corresponding signals associated with particular frequencies in the frequency domain spectrum, with un-occupied regions therebetween. For example, with respect to the input signal $V_{in}(t)$, the corresponding output frequency domain spectrum may be expected to have components only in particular frequency regions, such as frequency regions 222 and 224, with the remaining regions being originally un-occupied regions, such as frequency region 226. In this regard, content of the input signal, when observed at the output of a nonlinear analog front-end 200, would appear at the original locations in the frequency domain—i.e. the original locations 222 and 224, with possibly modified amplitude and phase information. The distortion (228), however, may be found in the output spectrum both at the locations of signals of interest as well as originally-unoccupied frequency regions (e.g. 226). Accordingly, the estimation of parameters utilized in a nonlinearity correction model or algorithm, implemented via the digital corrector 202 for example, may be performed based on comparison of the content of the distortion-only regions (e.g. 226) of the output spectrum to the signal-and-distortion regions of the output spectrum. In this regard, calibration of a nonlinearity correction model may be performed by determining the nonlinear weights which, when applied to the total spectral content, may minimize the distortion in originally-unoccupied spectral regions.

Figure 3A:
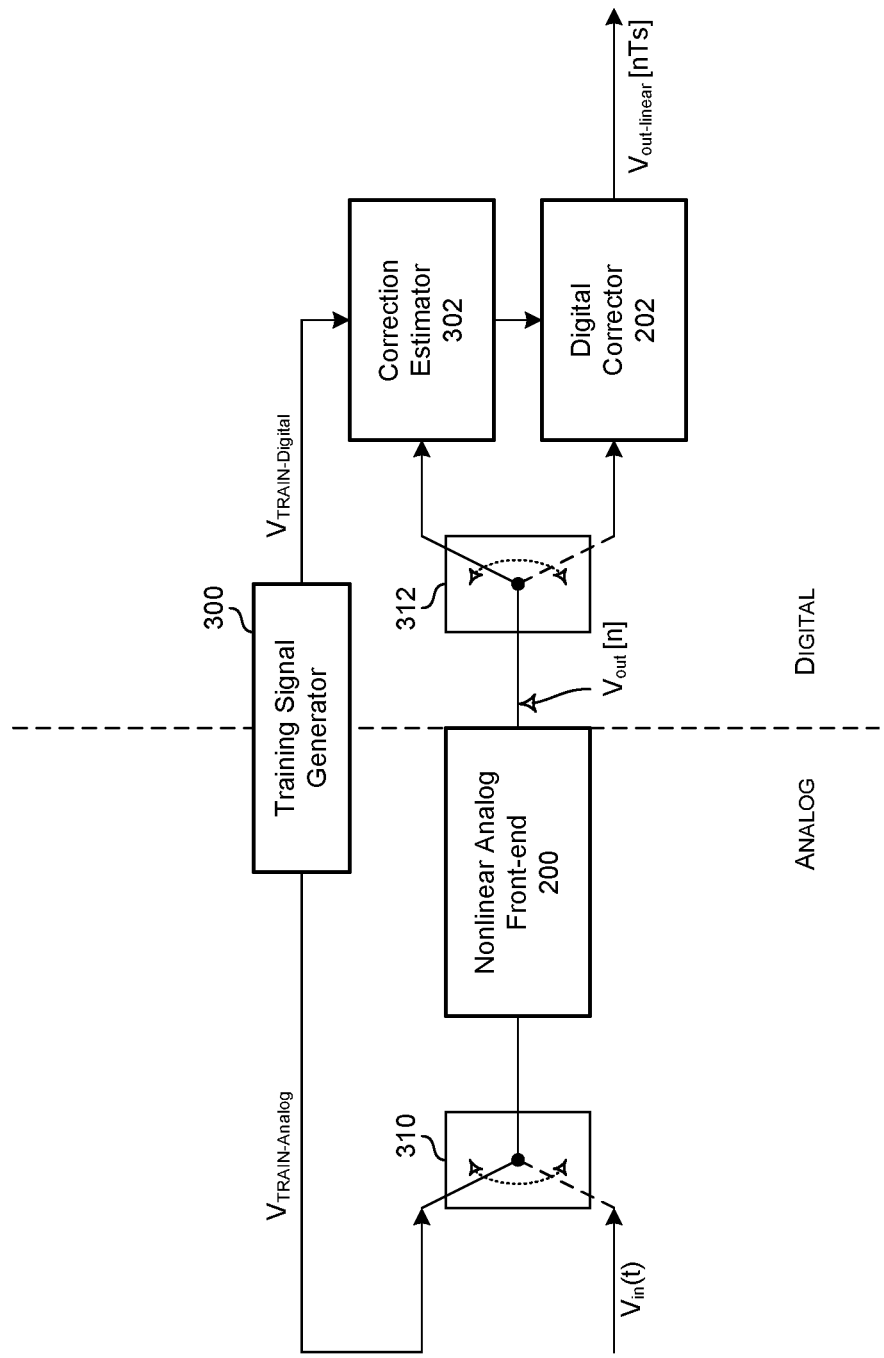
FIG. 3A is a block diagram illustrating foreground calibration of analog-to-digital nonlinearity in a broadband receiver using training signals, which may be utilized in connection with the invention.

FIG. 3A is a block diagram illustrating foreground calibration of analog-to-digital nonlinearity in a broadband receiver using training signals, which may be utilized in connection with the invention. Referring to FIG. 3A, there is shown the analog front-end 200 and the digital corrector 202 of FIG. 2. Also shown in FIG. 3A are training signal generator 300, the correction-parameter estimator 302, and selector modules 310 and 312.

The training signal generator 300 may comprise suitable logic, circuitry, interfaces, and/or code operable to generate signals having particular characteristics. In this regard, signals generated by the training signal generator 300 may be called training signals as they may be utilized in determining or estimating various characteristics of a system receiving and/or handling these signals. For example, the signals generated by the training signal generator 300 may be utilized as training signals for the purpose of determining nonlinearity characteristics of a particular system, such as the analog front-end 200, and/or for estimating nonlinearity related parameters, such as nonlinearity weights for the nonlinearity model applicable to the system.

The correction estimator 302 may comprise suitable logic, circuitry, interfaces, and/or code operable to generate nonlinearity correction information, which may be utilized via the digital corrector 202 to correct and/or reduce nonlinearity related error or distortion. In this regard, the correction-parameter estimator 302 may be operable to estimate and/or generate nonlinearity related parameters, such as nonlinearity weights for a nonlinearity model applicable to particular system, based on various input information. The correction estimator 302 may generate the nonlinearity correction information based on, for example, information relating to particular signals, and/or characteristics thereof. These particular signals may correspond to the training signals being generated by the training signal generator 300 for example.

The selector modules 310 and 312 may comprise suitable logic, circuitry, interfaces, and/or code for routing input signals to output signals. In this regard, the selector module 310 may be operable to set an output signal to one of a plurality of input signals; whereas the selector module 310 may be operable to set an input signal to one of a plurality of available output paths. For example, the selector module 310 may be utilized to set the input to the analog front-end 200 to one of the input analog signal or an analog training signal generated by the training signal generator 300. The selector module 312 may be utilized to route the output of analog front-end 200 to either the correction estimator 302 or to the digital corrector 202.

In operation, the system shown in FIG. 3A may be calibrated for nonlinearity correction. In this regard, the nonlinearity calibration may be performed only when the system is not being used for receiving and handling of input analog signals. In other words, the system may either be performing nonlinearity calibration or signal reception but not both (at this same time). This is described as foreground calibration. To perform nonlinearity calibration, the selector module 310 may be configured to pass the analog training signal $V_{TRAIN}$ generated by the training signal generator 300, and not the actual input analog signal $V_{in}(t)$, into the analog front-end 200. At the same time, the selector module 312 is configured to pass the output of the analog front-end 200 to the correction estimator 302. The correction-parameter estimator 302 also receives digital counterpart of the training signal $V_{TRAIN}$ generated by the training signal generator 300, which is used by the correction estimator 202 as reference for evaluating the output of the analog front-end 200. The correction-parameter estimator 302 may generate nonlinearity related information that may be needed to perform nonlinearity correction in accordance with the applicable nonlinearity correction model, such as the one described by equation (2). In this regard, the nonlinearity related information may comprise, for example, weights $\mu_i$. The correction estimator 302 may estimate the nonlinearity correction information by comparing the digital training signal $V_{TRAIN}$ received from training signal generator 300 with the digital signal generated by the analog front-end 200 based on the analog training signal $V_{TRAIN}$.

Once the nonlinearity calibration is completed—that is the nonlinearity correction information are determined and/or estimated, the system may switch to normal operation. In this regard, the selector module 310 may be configured to pass the input analog signal $V_{in}(t)$ to the analog front-end 200, and the selector module 312 may be configured to pass the output of the analog front-end 200 to the digital corrector 202. The digital corrector may then apply necessary nonlinearity correction, based on the applicable nonlinearity correction model, to eliminate or mitigate nonlinearity related errors or distortion using the estimated nonlinearity related information during the calibration stage.

Figure 3B:
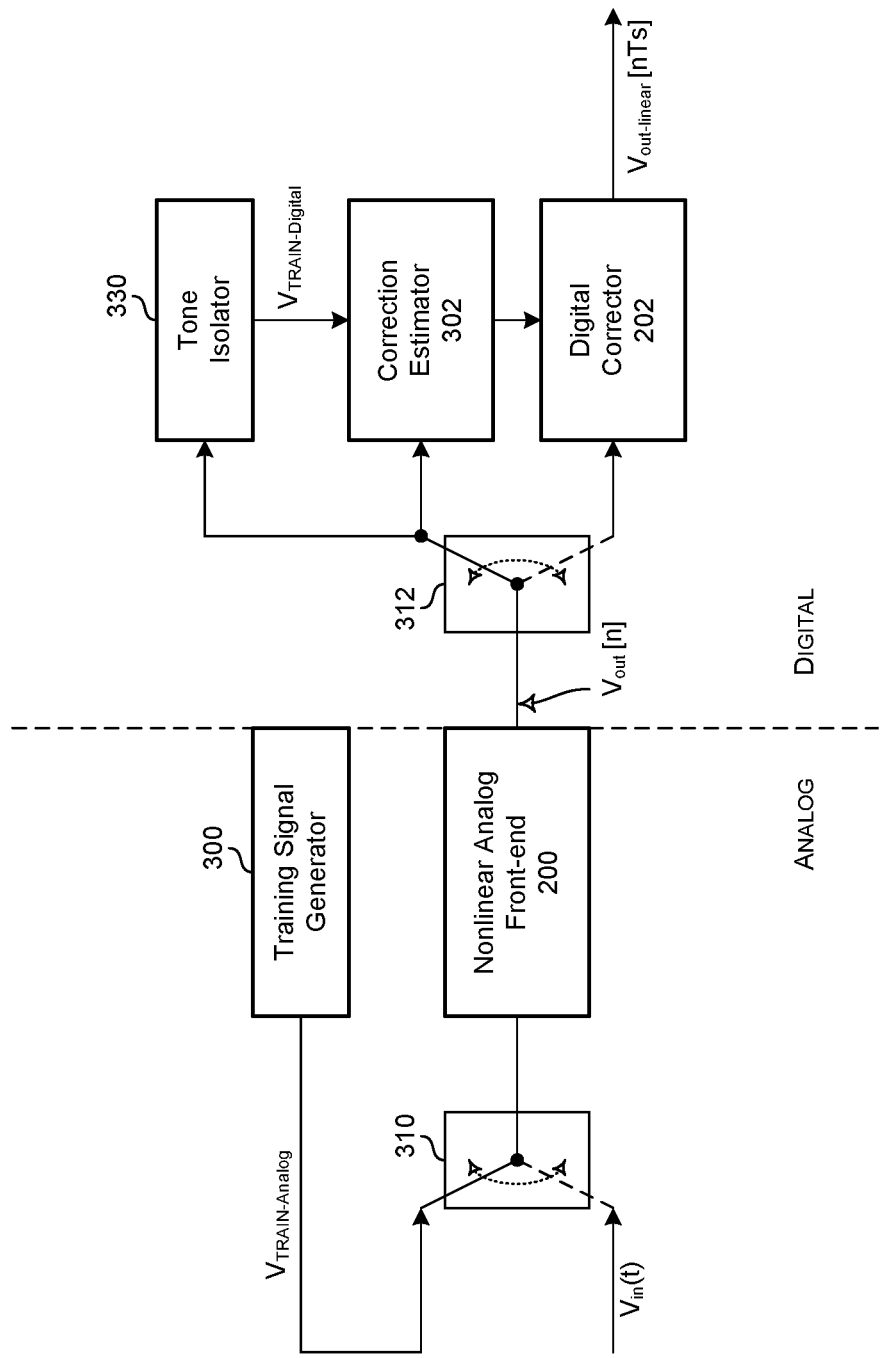
FIG. 3B is a block diagram illustrating pseudo-blind foreground calibration of analog-to-digital nonlinearity in a broadband receiver using training signals only in the analog domain, in accordance with an embodiment of the invention.

FIG. 3B is a block diagram illustrating pseudo-blind foreground calibration of analog-to-digital nonlinearity in a broadband receiver using training signals only in the analog domain, in accordance with an embodiment of the invention. Referring to FIG. 3B there is shown the analog front-end 200 and the digital corrector 202 of FIG. 2; and the training signal generator 300, the correction-parameter estimator 302, and selector modules 310 and 312 of FIG. 3A. Also shown in FIG. 3B is tone isolator 330.

The tone isolator 330 may comprise suitable logic, circuitry, interfaces, and/or code operable to isolate particular signals. In this regard, the isolated signals may comprise signals fitting particular criteria, such as being located within particular regions in the frequency spectrum. The particular regions may correspond to the locations of known training signals.

In operation, the system shown in FIG. 3B may generally function in similar manner as with the system of FIG. 3A. In this regard, the system shown in FIG. 3B may also perform foreground calibration where the calibration stage is performed separately from, and only when the system is not operating in normal signal handling mode; with the selector modules 310 and 312 being utilized to control the input and output of the analog front-end 200 in accordance of whether the system is operating in normal mode or in calibration mode.

In the system shown in FIG. 3B, however, the calibration is performed in pseudo-blind manner, where the correction estimation is performed based on determination of certain characteristics of particular signals, which may be done by use of signal isolation, thus obviating the need to directly receive, and process digital copies of the training signals being generated by the training signal generator 300. In this regard, the signal isolation may be focused on particular regions, such as regions where training signals are injected and/or regions that are originally un-occupied, and thus correspond to system distortion. Use of signal isolation may be sufficient because during nonlinearity calibration estimating the nonlinear correction information (e.g. nonlinear weights in the nonlinear model) may be based on correcting particular, predetermined locations in the frequency domain or spectrum—i.e., at specific frequencies, since nonlinearity does not typically affect the frequency of the input signals, and thus their locations in the frequency domain. In other words, nonlinearity related errors and/or distortion typically comprise changes to signals' amplitude and phase, but not frequency. Therefore, the reference signals that are utilized for calibration need not be accurate in terms of phase and gain if they can be separated from distortion in a spectral sense—i.e., their locations are known.

Typical training signals, such as those generated by the training signal generator 300, are tone(s) ideally occupying particular points in the frequency domain. Thus, if a tone is surrounded by distortion created by other signals in the spectrum and/or by itself, the correction estimation may be configured such that the target of a calibration is modified from matching the corrected output to the ideal input to simply matching the corrected output to the isolated output training tone. Accordingly, in an exemplary embodiment, the only reference information used for performing the correction estimation would be information about the frequency location of the training tone, while information about phase and amplitude would not be used.

Therefore, in the embodiment shown in FIG. 3B, the estimation performed by the correction estimator 302 is based on information provided by the tone isolator 330, which pertain to tones (signals) in the output of the analog front-end 200 at particular locations in the frequency domain. The tone isolator 330 may be configured with information defining these particular locations. In other words, the tone isolator 330 may be setup to focus on the locations at which the training signal generator 300 injects the training signals.

Figure 4A:
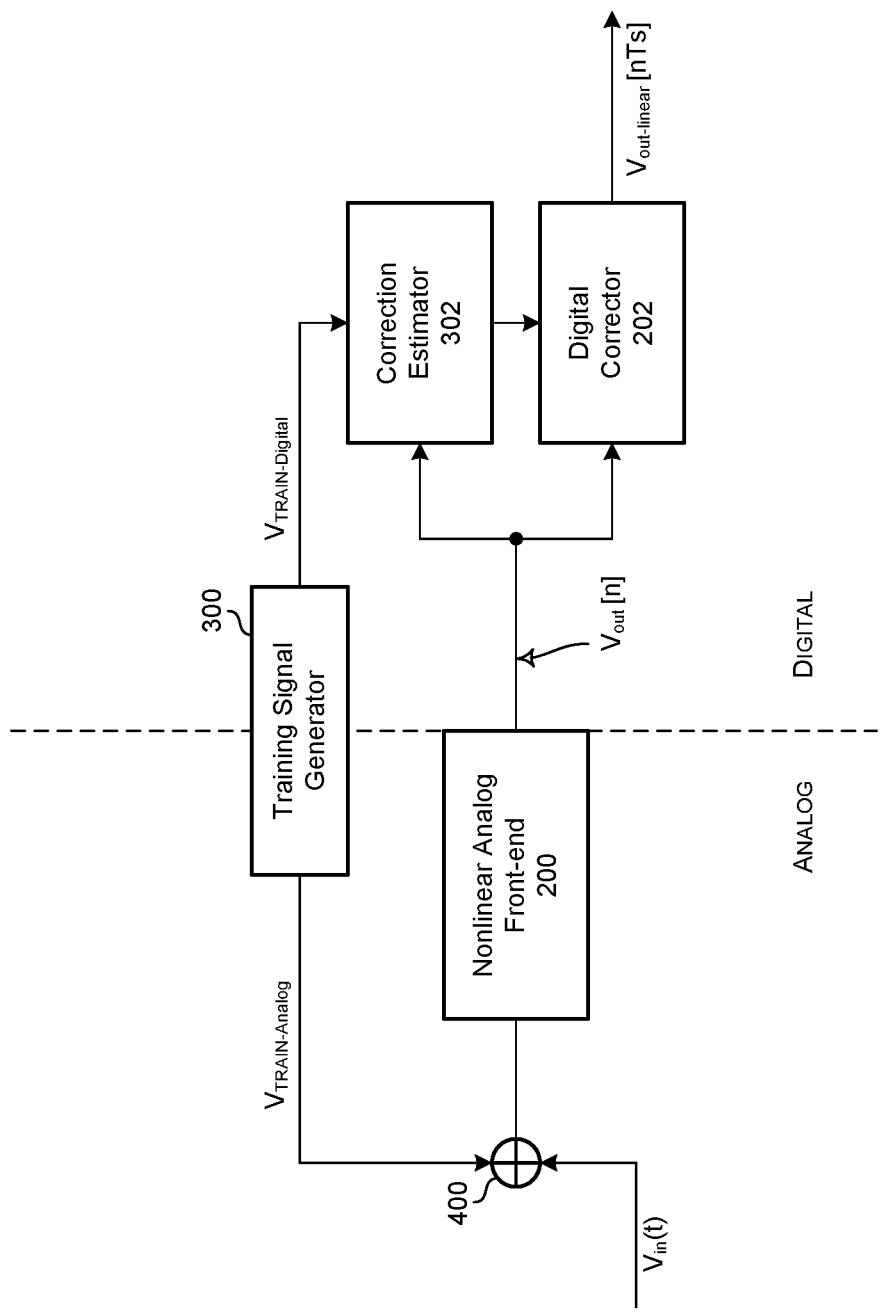
FIG. 4A is a block diagram illustrating background calibration of analog-to-digital nonlinearity in a broadband receiver using training signals, in accordance with an embodiment of the invention.

FIG. 4A is a block diagram illustrating background calibration of analog-to-digital nonlinearity in a broadband receiver using training signals, in accordance with an embodiment of the invention. Referring to FIG. 4A there is shown the analog front-end 200 and the digital corrector 202 of FIG. 2; and the training signal generator 300 and the correction estimator 302 of FIG. 3A. Also shown in FIG. 4A is adder 400.

The adder 400 may comprise suitable logic, circuitry, interfaces, and/or code operable to combine (add) a plurality of signals.

In operation, the system shown in FIG. 4A may be calibrated for nonlinearity correction, and this can be done while the system is being used for receiving and handling of input analog signals. In other words, the system may simultaneously perform nonlinearity calibration and signal reception and handling. This is described as background calibration. The background calibration approach may be utilized, for example, in scenarios where the input signals have known, unoccupied spectral regions, where the training signals being utilized for calibrating the system may be injected. Where a system, such as the analog front-end 200, exhibits nonlinearity (static or dynamic), the system's nonlinearity would similarly affect both locations (in the frequency domain) corresponding to regions where the content in the original input signal is present and originally-unoccupied frequency regions. Thus, calibrating the nonlinearity correction model may be performed simply based on correcting the un-occupied regions—that is determining nonlinearity related information required for correcting the nonlinearity causing distortion in the originally un-occupied regions, would also enable correcting nonlinearity errors and/or distortion originally occupied (by actual content) regions in the spectrum.

In the embodiment shown in FIG. 4A, background nonlinearity calibration may be performed by injecting training (reference) signals into the system input to calibrate the nonlinearity correction model. In this regard, analog training signal $V_{TRAIN}$ generated by the training signal generator 300 may be combined, via adder 400, with the input analog signal $V_{in}(t)$, and the combination is then inputted into the analog front-end 200. In this regard, the training signal generator 300 may generate the training signal $V_{TRAIN}$ such that it may be located within the frequency domain in region(s) originally un-occupied by the input signal $V_{in}(t)$, such as region 226. The output of the analog front-end 200 is then passed to both the correction estimator 302 and the digital corrector 202. The correction estimator 302 may also receive digital counterpart of the training signal $V_{TRAIN}$ generated by the training signal generator 300, which is used by the correction estimator 202 as reference for evaluating the output of the analog front-end 200. The correction estimator 302 may generate nonlinearity related information (e.g. weights $\mu_i$) that may be needed to perform nonlinearity correction in accordance with the applicable nonlinearity correction model.

In this regard, the correction estimator 302 may estimate the nonlinearity correction information by analyzing the frequency spectral locations of the training signal $V_{TRAIN}$, which correspond to the originally un-occupied frequency regions, based on knowledge of the training signal $V_{TRAIN}$—since it was received from training signal generator 300. The correction estimator 302 may determine, based on that analysis, the distortion caused by the system's nonlinearity in these regions, and accordingly may estimate the correction required to mitigate the distortion. The nonlinearity related information is then provided to the digital corrector 202, to enable correcting nonlinearity related distortion in the output signal(s). The digital corrector 202 may incorporate some delay when handling the output signal received from the analog front-end 200, to account for the processing delays required for the correction estimator 302 to perform its operation. This delay may occur during system start-up. Any variation in the analog front-end's nonlinearity occurring during the operation of the system can be potentially estimated by the correction-parameter estimator with negligible delay.

Figure 4B:
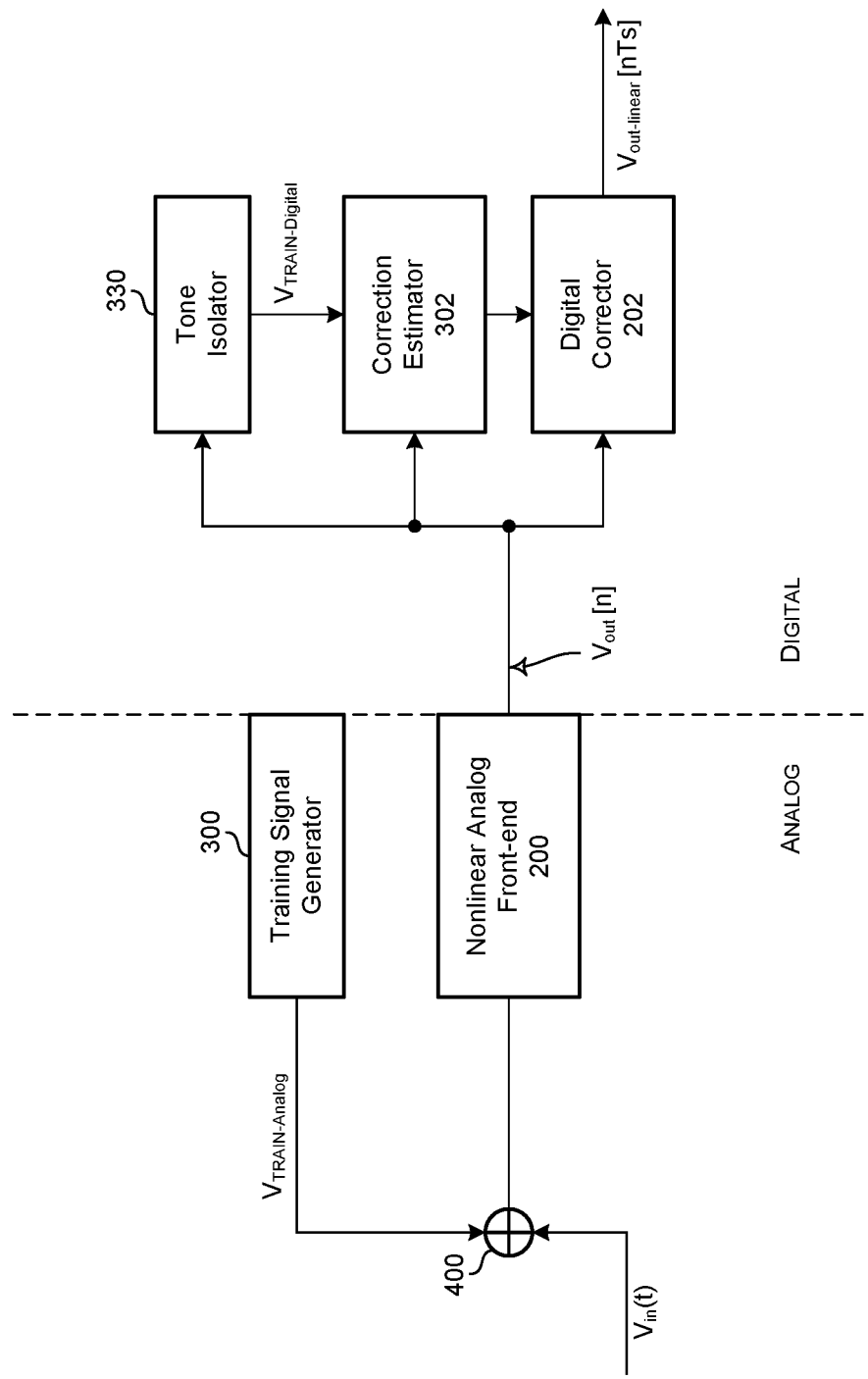
FIG. 4B is a block diagram illustrating pseudo-blind background calibration of analog-to-digital nonlinearity in a broadband receiver using training signals only in the analog domain, in accordance with an embodiment of the invention.

FIG. 4B is a block diagram illustrating pseudo-blind background calibration of analog-to-digital nonlinearity in a broadband receiver using training signals only in the analog domain, in accordance with an embodiment of the invention. Referring to FIG. 4A there is shown the analog front-end 200 and the digital corrector 202 of FIG. 2; the training signal generator 300 and the correction estimator 302 of FIG. 3A; the tone isolator 330 of FIG. 3B; and the adder 400 of FIG. 4A.

In operation, the system shown in FIG. 4B may generally function in similar manner as with the system of FIG. 4A. In this regard, the system shown in FIG. 4B may also perform background calibration, with calibration of nonlinearity correction being performed concurrent to the reception and handling of input signals. In the system shown in FIG. 4B, however, the background calibration is performed in a pseudo-blind manner, where the correction estimation is performed based on signal isolation, thus obviating the need to directly receive, and process digital copies of the training signals being generated by the training signal generator 300. In this regard, the estimation performed by the correction estimator 302 is based on information provided by the tone isolator 330, which isolate signals in the output of the analog front-end 200 at locations in the frequency domain where the training signals are injected, based on prior knowledge of originally un-occupied regions, associated with the input signal $V_{in}(t)$, in the spectral output of the analog front-end 200. Therefore, the correction estimator 302 may estimate the nonlinearity correction information based on analyzing distortion in spectral locations isolated by the tone isolator 330. The correction estimator 302 may then generate or estimate the nonlinearity correction information required to perform, via the digital corrector 202, the applicable nonlinearity correction model.

Figure 4C:
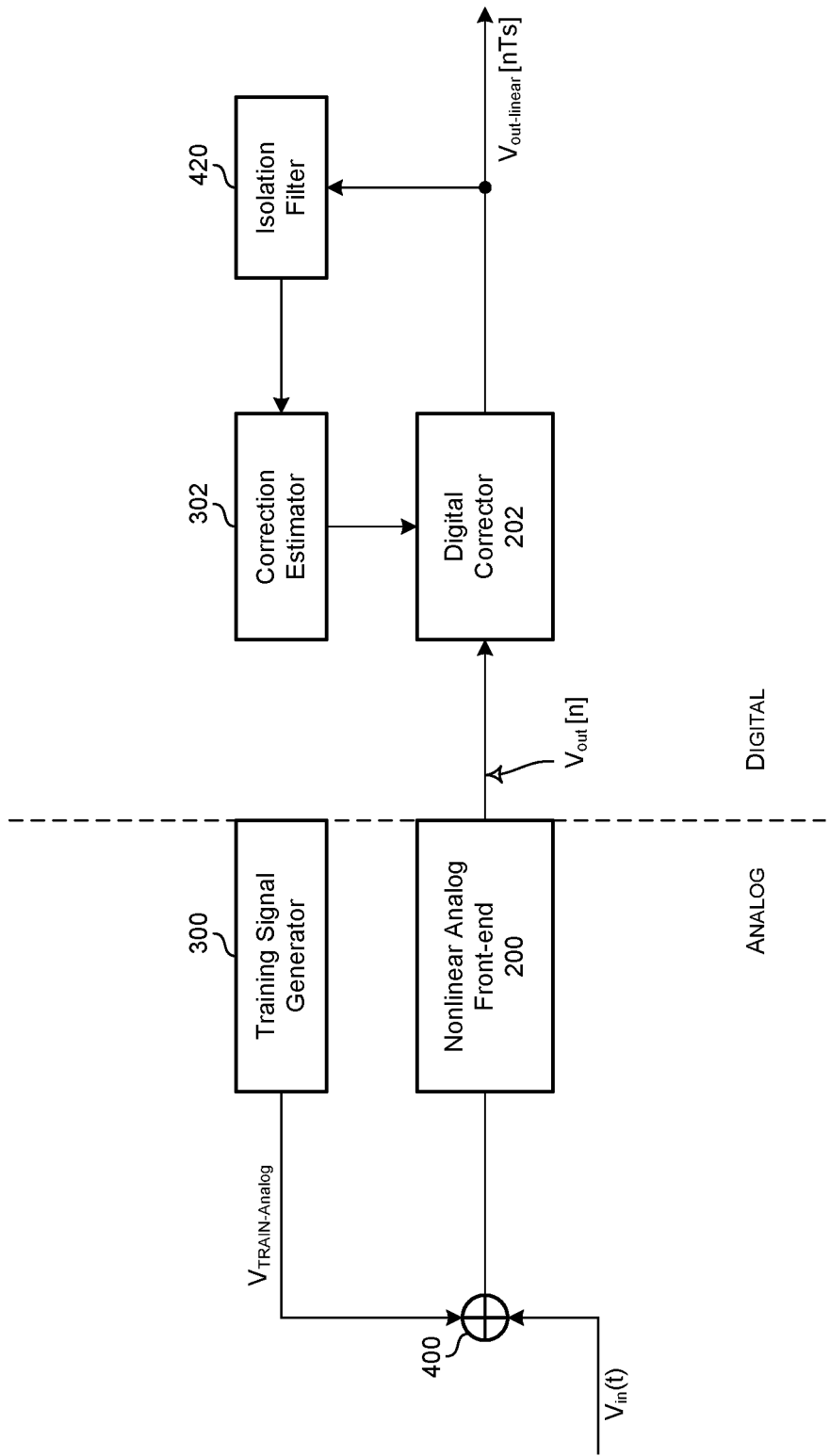
FIG. 4C is a block diagram illustrating background calibration of analog-to-digital nonlinearity in a broadband receiver using training signals and with isolation filtering in the digital domain, in accordance with an embodiment of the invention.

FIG. 4C is a block diagram illustrating background calibration of analog-to-digital nonlinearity in a broadband receiver using training signals and with isolation filtering in the digital domain, in accordance with an embodiment of the invention. Referring to FIG. 4C there is shown the analog front-end 200 and the digital corrector 202 of FIG. 2; the training signal generator 300 and the correction estimator 302 of FIG. 3A; and the adder 400 of FIG. 4. Also shown in FIG. 4C is an isolation filter 420.

The isolation filter 420 may comprise suitable logic, circuitry, interfaces, and/or code operable to filter signals having particular characteristics and/or based on particular filtering. In this regard, the isolation filter 420 may be configured to filter signals within particular regions in the frequency spectrum. The particular regions may correspond to, for example, originally-unoccupied spectral regions, such as region 226.

In operation, the system shown in FIG. 4C may generally function in a similar manner as the system of FIG. 4A. In this regard, the system shown in FIG. 4C may also perform background calibration, with calibration of nonlinearity correction being performed concurrent to the reception and handling of input signals. Furthermore, the system shown in FIG. 4C may also allow for enhancing the correction estimation based on post-correction isolation filtering. In this regard, use of isolation filtering after correction may enable minimizing distortion in the originally-unoccupied spectral regions because the signal subjected to isolation filtering may be considered stationary during calibration, thus allowing for the use of adaptive filtering or optimization algorithms, including simple Least Mean Squared.

Figure 4D:
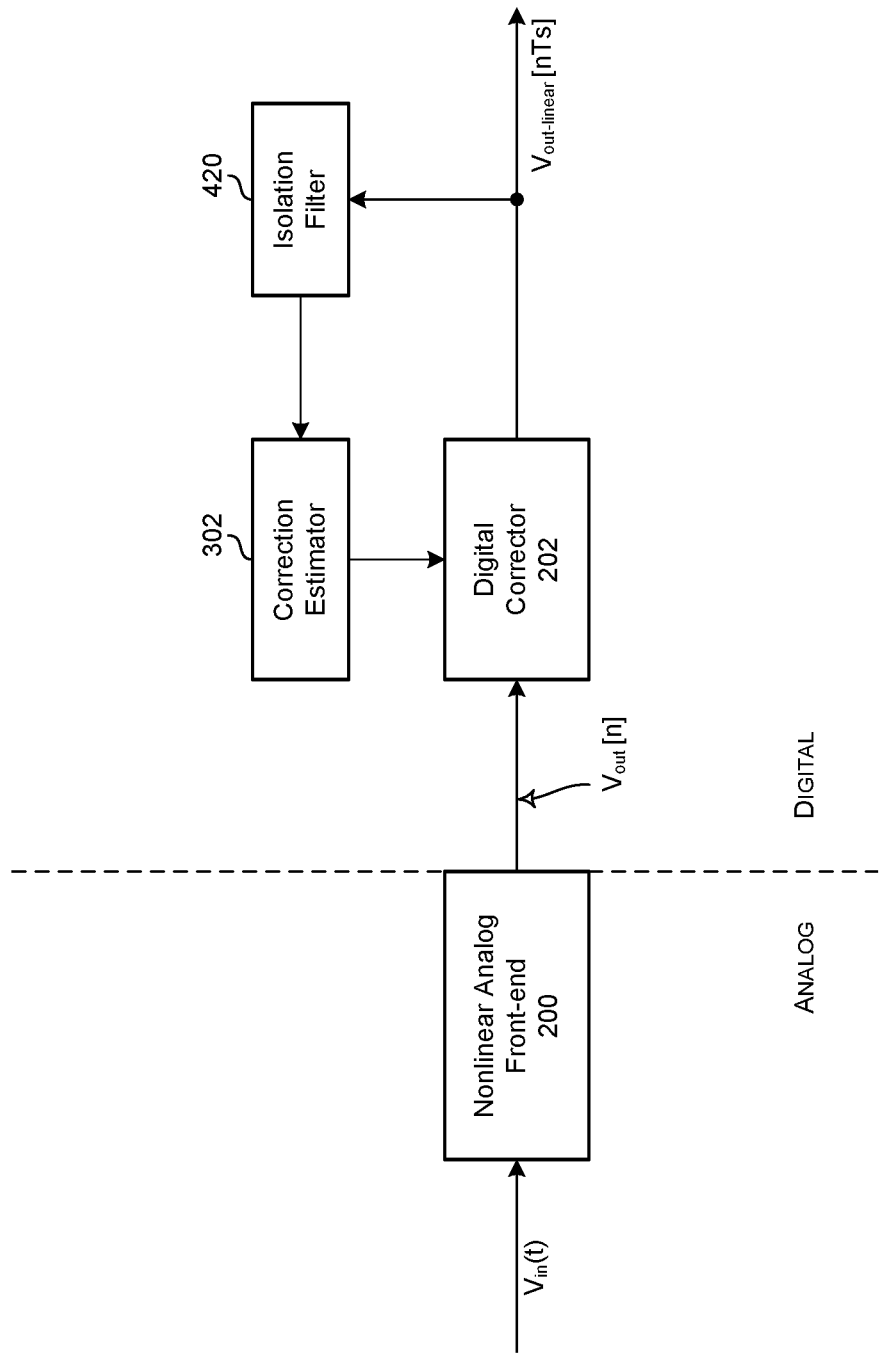
FIG. 4D is a block diagram illustrating pseudo-blind background calibration of analog-to-digital nonlinearity in a broadband receiver, without training signals, using isolation filtering in the digital domain, in accordance with an embodiment of the invention.

FIG. 4D is a block diagram illustrating pseudo-blind background calibration of analog-to-digital nonlinearity in a broadband receiver, without training signals, using isolation filtering in the digital domain, in accordance with an embodiment of the invention. Referring to FIG. 4D there is shown the analog front-end 200 and the digital corrector 202 of FIG. 2; the correction estimator 302 of FIG. 3A; and the isolation filter 420 of FIG. 4C.

In operation, the system shown in FIG. 4D may perform background calibration, with calibration of nonlinearity correction being performed concurrent to the reception and handling of input signals, and without any injection of training signals. Rather, the correction estimation performed by the correction estimator 330 is solely focused on distortion in the originally un-occupied regions. In other words, because there is no training signal injection, it is presumed that the distortion in the originally un-occupied regions is solely caused by the system nonlinearity, and as such the correction estimation is based on finding the nonlinear parameters (e.g. weights) that when applied to the total spectral content, would minimize the distortion in originally-unoccupied spectral regions as much as possible, with complete elimination of distortion in these regions being the ultimate goal. The correction estimation in the system shown in FIG. 4C is further enhanced by basing the estimation on post-correction isolation filtering with respect to the target location—that is the originally un-occupied regions, as described with respect to FIG. 4C. Use of post-correction isolation filtering, via isolation filter 420, is also possible because since there is no injection of training signals, there would be no additional content in the sampled/digital signal, other than the distortion related content. Therefore, by filtering at the originally un-occupied regions, the only content obtained is distortion related content (e.g. resulting from system nonlinearity), and the estimation processing would be based on correction necessary to remove that distortion related content.

Figure 5A:
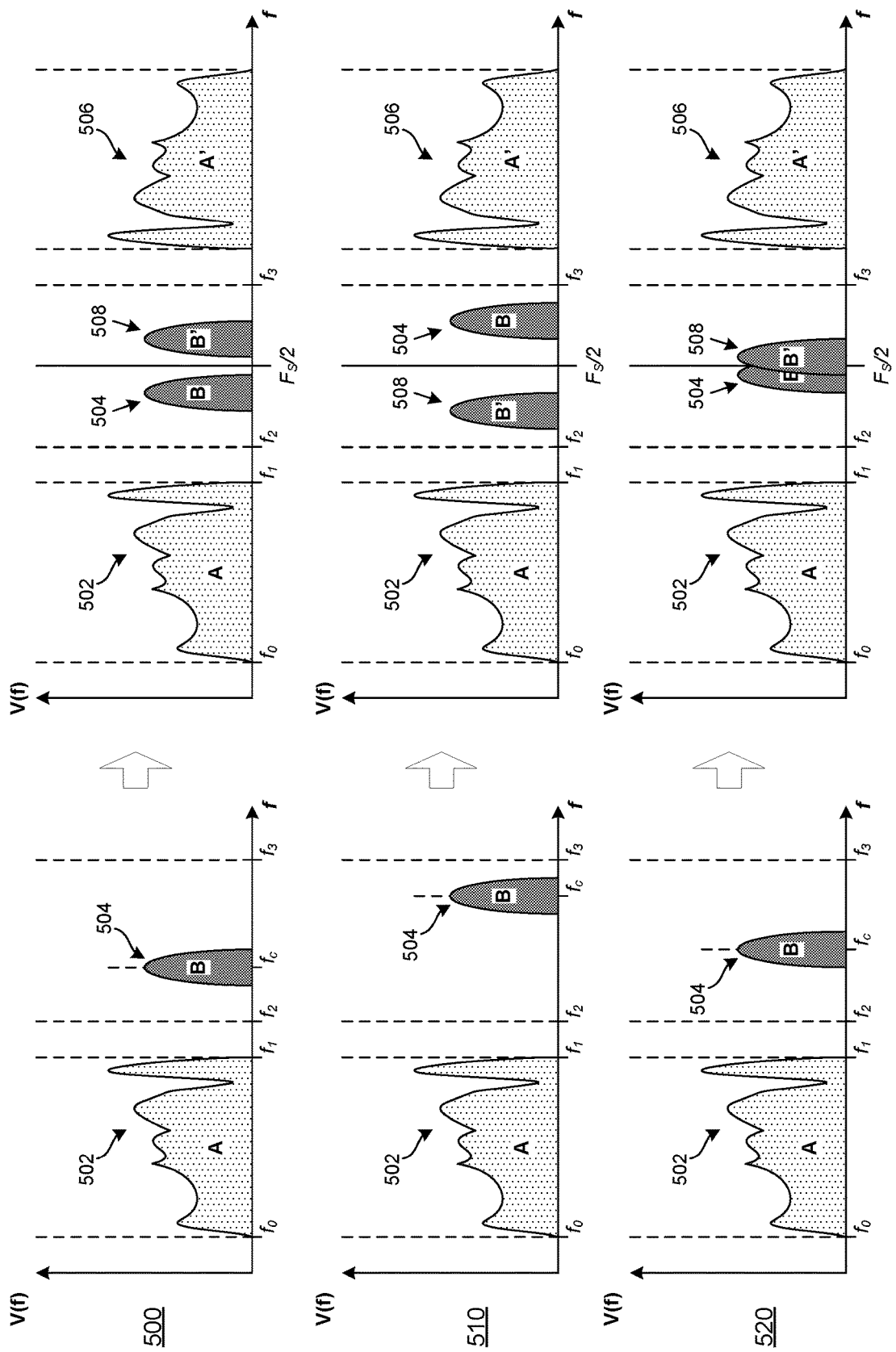
FIG. 5A is a diagram illustrating frequency domain representations of sampling of a multi-band signal in which one of the bands may have variable center frequency, in connection with an embodiment of the invention.

FIG. 5A is a diagram illustrating frequency domain representations of sampling of a multi-band signal in which one of the bands may have variable center frequency, in connection with an embodiment of the invention. Referring to FIG. 5A, there is shown frequency domain spectrum diagrams 500, 510, and 520, representing voltage values as function of frequency, and corresponding to multi-band signals—that signals having in the frequency domain multiple bands at different frequency ranges.

The multi-band signals may comprise, for example, a cable television signal, which may comprise plurality of channels at different frequencies corresponding to TV channels. The invention, however, is not limited to cable television signals, and may be applied similarly to any signals have the property of having multiple different bands. For example, as shown in spectrum diagram 510, the multiple bands may comprise band A (502) and band B (504). In this regard, the band A (502) may comprise several channels or signals that exist in the spectral range [$f_0$, $f_1$]. The band B (504) may be a fixed channel, having a bandwidth of $BW_B$, being centered at a frequency $f_c$ in the range of frequencies [$f_2$, $f_3$]. During reception and/or processing of the original multi-band signal, one or more of the corresponding bands may need to be properly received and processed. For example, in some instances, only the band A (502) may need to be received, such as when only the content carried via band A (502) frequency is desired. At other times, however, content carried via band B (504) frequency may also be desired. In these situations—that is when reception of both bands, and extraction of content carried therein, is desired—use of dedicated anti-aliasing processing, in accordance with the invention, may be necessary.

With respect to the reception of band A (502), this may be achieved by sampling at a high enough rate such that the range of frequencies [$f_2$, $f_3$], aliased or otherwise, may lie completely outside the range [$f_0$, $f_1$] at the output of the sampler. In other words, band A (502) may be sampled such that band B (504) would not alias on top of band A (502). This is shown in all of spectrum diagrams 500, 510 and 510, where the mirror image of band A (502), represented as A' (506), lies beyond frequency $f_3$, with the mirror image of band B (504), represented as B' (508), lying within the range of frequencies [$f_2$, $f_3$], and as such there is no aliasing of band A (502). To that end, the lowest sampling rate $F_S$ that may be utilized without the band B (504) aliasing on top of band A (502) is given by equation (3):

$$\frac{F_S}{2} - f_1 > f_3 + BW_B - \frac{F_S}{2} \Rightarrow F_S > f_3 + f_1 + BW_B \quad (3)$$

As for band B (504), based on the location of the center frequency $f_c$ of band B (504), there are three scenarios of what may happen to band B (504) when sampling to successfully receive band A (502), as shown in the spectrum diagrams 500, 510 and 520, respectively. In this regard, as demonstrated in spectrum diagram 500, band B (502) may be received correctly in the sampled domain. This may occur, for example, when band B (504) is originally centered at $f_c$ having a value is less than $(F_S-BW_B)/2$. In some instances, as demonstrated by spectrum diagram 510, band B (502) may be received in mirror image B' (504), centered at $F_S-f_c$ with no self-aliasing. This may occur, for example, when band B (504) is originally centered at $f_c$ having a value that is greater than $(F_S+BW_B)/2$. In some instances, however, as demonstrated by spectrum diagram 520, self-aliasing of the band B (504) may occur during sampling—that the mirror image of band B (502), B' (508), may alias on top of the band B (502). This may occur, for example, when band B (504) is originally centered at $f_c$ where: $(F_S-BW_B)/2 < f_c < (F_S+BW_B)/2$. Accordingly, in various embodiments of the invention, a system receiving and processing multi-band signals may be configured to recover and acquire bands which may be subject to self-aliasing when sampling for other bands, and as such would otherwise be lost, such as B (504) in scenario 520.

Figure 5B:
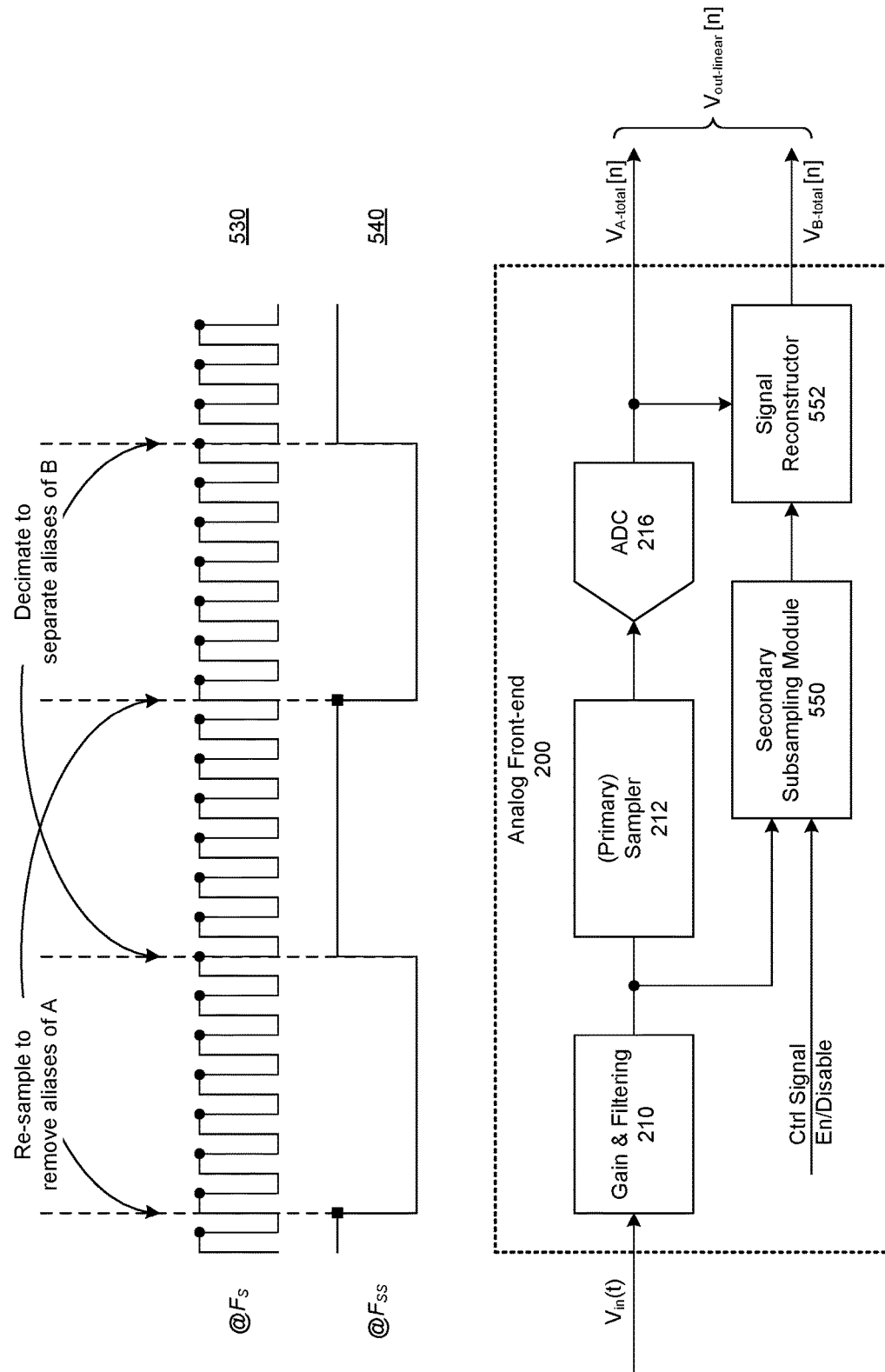
FIG. 5B is a block diagram illustrating signal processing system that supports use of secondary subsampling during handling of multi-band signals to recover bands subjected to self-aliasing, in accordance with an embodiment of the invention.

FIG. 5B is a block diagram illustrating a signal processing system that supports use of secondary subsampling during the handling of multi-band signals to recover bands subjected to self-aliasing, in accordance with an embodiment of the invention. Referring to FIG. 5B, there is shown the analog front-end 200, the gain and filtering module 210, the sampler 212, and the ADC 216 of FIG. 2. Also shown in FIG. 5B is a secondary subsampling module 550 and a signal reconstructor 552.

The secondary subsampling module 550 may comprise suitable logic, circuitry, interfaces, and/or code for performing secondary subsampling processing, to enable recovering and/or reconstructing particular bands in multi-band signals, which may otherwise be unavailable or distorted due to self-aliasing resulting from sampling to receive other bands. The secondary subsampling module 550 may, for example, be operable to perform sampling and analog-to-digital conversion, which may enable recovering band B (502) of FIG. 5A in instances where sampling to receive band A (502) may cause self-aliasing of band B (502), as demonstrated by spectrum diagram 520 of FIG. 5A. The signal reconstructor 552 may comprise suitable logic, circuitry, interfaces, and/or code for performing signal reconstruction processing, subsequent to the secondary subsampling processing, to enable recovering and/or reconstructing self-aliased signals. In this regard, the operations performed by the signal reconstructor 552 may correspond to digital domain based processing performed subsequent to the secondary sampling and analog-to-digital conversion performed by the secondary subsampling module 550.

Self-aliasing problems may be remedied by varying the sampling rate $F_S$ to avoid self-aliasing of the desired band (e.g. band B (504)). Lowering the sampling rate $F_S$ may cause temporarily aliasing of band A (502), such as when band B (504) changes location (since it has variable center frequency), which may cause band B (504) to alias over band A (502), at least temporarily until the system adjusts—by readjusting the sampling rate $F_S$ again. Varying the sampling clock rate may be done using rate modification circuitry, which may interface the ADC output with the digital domain. If the digital domain maintains a single clock speed then the band B (504) is recovered at the new clocking rate, independently, before re-timing to the original clock speed.

In various embodiments of the invention, recovering, reconstructing and/or acquiring bands that are subject to self-aliasing may be achieved by use of a secondary subsampling path, which may enable performing another out-of-phase self-aliased measurement of these bands. The secondary subsampling path may comprise the secondary subsampling module 550, which perform the sampling and analog-to-digital conversion, and the signal reconstructor 552, which may perform the subsequent digital domain based signal reconstruction operations. In this regard, the secondary subsampling module 550 may be used, running in parallel with the primary sampler—that is sampler 212, to sample for the self-aliased band(s), with the signal reconstructor 552 being utilized to reconstruct the self-aliased band(s) in the digital domain, subsequent to operations of the secondary subsampling module 550, and based on, at least in part, output of the secondary subsampling module 550. During operations of the secondary subsampling path—that is operations of the secondary subsampling 550 and the signal reconstructor 552, which may comprise subsampling, analog-to-digital conversion, and reconstruction based thereon—the secondary subsampling path may run at a lower speed and with an out-of-phase sampling clock. The output of the secondary subsampling path may comprise a secondary measurement of the self-aliased band(s), on top of the band(s) being sampled via the (primary) sampler 212, but severely aliased in the secondary subsampling module 550. The signal reconstructor 552 may be utilized to reconstruct the self-aliased band(s) based on the digital outputs of the primary path and the secondary sampling module 550. In this regard, the output of the primary path may correspond to the digital output corresponding to the primary band that is targeted by the (primary) sampler 212, which may be obtained after the analog-to-digital conversion via the ADC 216. The total digital output corresponding to the input analog signal may, accordingly, comprise the outputs of the primary path and the secondary path may comprise the digital output, $V_{A\text{-}total}[n]$, corresponding to the primary band, band A (502), and the digital output, $V_{B\text{-}total}[n]$, corresponding to the secondary, self-aliased band, band B (504).

The sampling rate utilized in the secondary subsampling path, which may be different from the sampling rate used by the (primary) sampler 212, may be selected such that the target bands alias on top of the bands being sampled in the primary path. In this regard, the secondary sampling rate, $F_{SS}$, may be set to $F_S/(2n+1)$, such that band B (504) may alias at $F_S/2$, and recovery of band B (502) would be simplified. The lower bound on the secondary sampling rate $F_{SS}=F_S/(2n+1)$ is given by equation (4):

$$F_{SS} = \frac{F_S}{2n+1} > 2BW_B \Rightarrow n < \frac{F_S}{4BW_B} - 0.5, n \in \aleph \quad (4)$$

In an embodiment of the invention, use of the secondary subsampling path may be selective and/or optional. For example, because self-aliasing only occurs in certain scenarios, as demonstrated by spectrum diagram 520, recovering secondary bands may not require use of the processing performed in the secondary subsampling path. In such instances where secondary bands (e.g. band B (504)) may be recovered directly in sampled domain (e.g., spectrum diagram 500) or from their mirror images (e.g., spectrum diagram 5 10), the secondary subsampling path may be bypassed, thus saving processing, time, and/or energy. Bypassing the secondary subsampling path may be achieved by use of control signals, which only activate (enable) the secondary subsampling path when self-aliasing may occur.

Figure 5C:
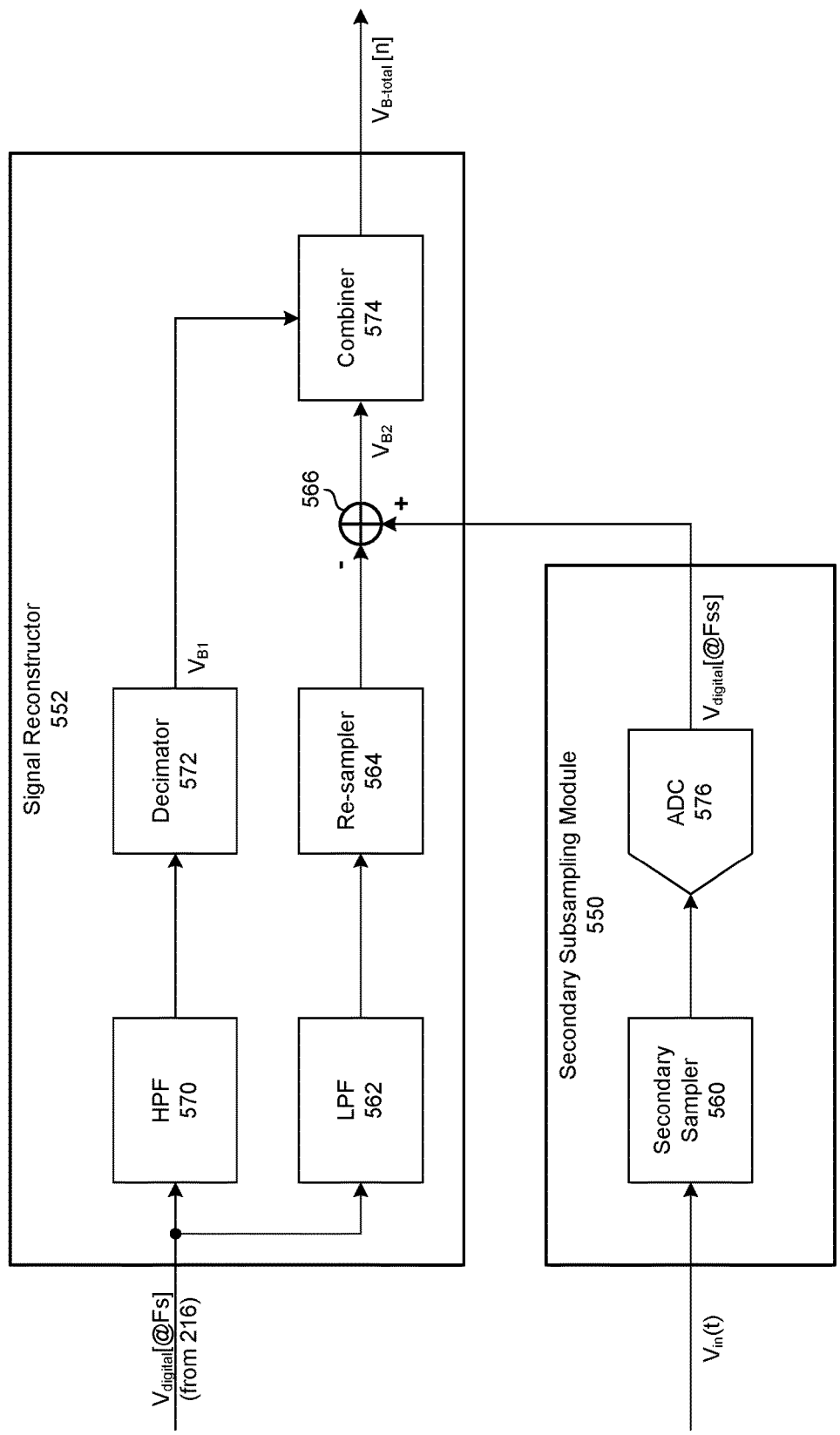
FIG. 5C is a block diagram illustrating an exemplary secondary subsampling path in an analog front-end, in accordance with an embodiment of the invention.

Timing diagrams 530 and 540 show timing of the sampling operations, corresponding to primary sampling and secondary subsampling, to enable out-of-phase sampling, and digital recovery of self-aliased bands, such as band B (504), in accordance with an embodiment of the invention. In this regard, timing diagram 530 shows sampling timing of primary sampling, performed via the sampler 212, of band A (502), at the corresponding sampling rate, $F_S$, which enable capturing band A (502) perfectly, and generating its corresponding digital output $V_{A\text{-}total}[n]$. Accordingly, as shown in the timing diagram 540, to recover band B (504) and to generate its corresponding digital output $V_{B\text{-}total}[n]$, via the secondary subsampling module 550 and the signal reconstructor 552, the primary digital output, corresponding to the analog-to-digital conversion of the primary sampler, may be filtered and re-sampled at particular timing instances indicated by the sampling rate, $F_{SS}$, of the secondary path. The result may then be subtracted from the output of analog-to-digital conversion of the sampling operation within the secondary path to remove all aliases of the band A (502). The band B (504) may then be reconstructed, from its orthogonal measurements, for example by high-pass filtering then decimating the output of the primary sampler at second set of time instances indicated by the sampling rate, $F_{SS}$, of the secondary path. In this regard, the time instances for these two sets of operation, to generate two different components of the target band (e.g. band B (504)) may alternate, as shown by timing diagrams 530 and 540. FIG. 5C described a system for implementing the subsampling path in accordance with the embodiment disclosed herein.

While the secondary subsampling path is described herein with respect to the analog front-end 200, use of secondary subsampling is not so limited, nor is it limited to use in conjunction with nonlinearity correction and calibration as described in the previous figures. Rather, secondary subsampling may be utilized, separately and/or independent of any other processing operation, in any system receiving multi-band signals, where sampling a particular band may subject other band(s), which are also to be handled, to self-aliasing.

FIG. 5C is a block diagram illustrating an exemplary secondary subsampling path in an analog front-end, in accordance with an embodiment of the invention. Referring to FIG. 5C, there is shown the secondary subsampling module 550 and the signal reconstructor 552 of FIG. 5B. Also shown in FIG. 5C are a secondary sampler 560, a low-pass filter (LPF) 562, a re-sampler 564, a subtractor 566, a high-pass filter (HPF) 570, a decimator 572, a combiner 574, and secondary analog-to-digital converter (ADC) 576. In this regard, the secondary subsampling module 550 may comprise the secondary sampler 560 and the ADC 576; whereas the signal reconstructor 552 may comprise the LPF 562, the re-sampler 564, the subtractor 566, the HPF 570, the decimator 572, and the combiner 574.

The secondary sampler 560 may be similar to the sampler 212, as described with respect to FIG. 2 for example. In this regard, the secondary sampler 560 may comprise suitable logic, circuitry, interfaces, and/or code for sampling analog signals, at a particular sampling rate, to generate a sequence of samples—that is discrete-time signals based on input analog signals. As with the sampler 212, the secondary sampler 560 may also be configured to read the value of the continuous input analog signal at certain, periodic intervals, at determined by its own sampling rate. The passage of the input signals may then be switched off, in between the read points, and the output voltage is held constant when the input signal is switched off.

The LPF 562 may comprise suitable logic, circuitry, interfaces, and/or code for performing low-pass filtering operations. In this regard, the LPF 562 may be operable to pass low-frequency signals while attenuating signals with frequencies higher than a cutoff frequency of the LPF 562.

The re-sampler 564 may comprise suitable logic, circuitry, interfaces, and/or code operable to perform signal re-sampling, which may comprise computing values of new samples based on other (old) samples associated with the input signal.

The subtractor 566 may comprise suitable logic, circuitry, interfaces, and/or code operable to subtract an input signal from another input signal.

The HPF 570 may comprise suitable logic, circuitry, interfaces, and/or code for performing high-pass filtering operations. In this regard, the HPF 562 may be operable to pass high-frequency signals while attenuating signals with frequencies lower than a cutoff frequency of the HPF 570.

The decimator 572 may comprise suitable logic, circuitry, interfaces, and/or code operable to perform signal decimation, which may comprise reducing the number of samples in a discrete signal.

The combiner 574 may comprise suitable logic, circuitry, interfaces, and/or code operable to combine a plurality of signals. In this regard, the combiner 574 may combine the two different components associated with the same signals, in a manner similar to combining the I-component and Q-component of a signal.

The ADC 576 may be similar to the ADC 216, as described with respect to FIG. 2 for example. The ADC 576, however, may be configured to operate in accordance with the sampling rate utilized in the secondary subsampling module 550.

In operation, the secondary subsampling module 550 and the signal reconstructor 552 may be utilized to sample, recover and reconstruct a self-aliased band during reception and handling of multi-band signal, where the self-aliasing may be cause by sampling, via a primary sampler (e.g. the sampler 212), for another band in the multi-band signal. For example, the secondary subsampling module 550 and the signal reconstructor 552 may enable out-of-phase sampling, and digital recovery of band B (504) when it is self-aliased. In this regard, recovering the self-aliased band may comprise reconstructing it from its orthogonal components, which may be generated based on both the primary sampling and sampling via the secondary sampler, which has a distinct sampling rate ($F_{SS}$). To obtain the first component, represented in FIG. 5C as $V_{B1}$, the output of analog-to-digital conversion (via the ADC 216) of the primary sampler (sampler 212), represented herein as primary output $V_{digital}[@F_S]$, may be high-pass filtered via the HPF 570, and then decimating via the decimator 572. The second component, represented in FIG. 5C as $V_{B2}$, may be obtained by low-pass filtering, via the LPF 562, the primary digital output $V_{digital}[@F_S]$, and then re-sampling it via the re-sampler 564, and then subtracting the result, via subtractor 566, from the digital output of the secondary digital output, represented herein as $V_{digital}[@F_{SS}]$. In this regard, the secondary digital output $V_{digital}[@F_{SS}]$ may be obtained by performing analog-to-digital conversion, via ADC 576, on the output on the secondary sampler 560, which may perform a dedicated sampling operation within the secondary subsampling module 550 to remove all aliases of the band A (502). The two components ($V_{B1}$ and $V_{B2}$) may then be combined, via the combiner 574, to obtain the digital output $V_{B\text{-}total}[n]$ corresponding to the self-aliased band (band B (504)).

Figure 6B:
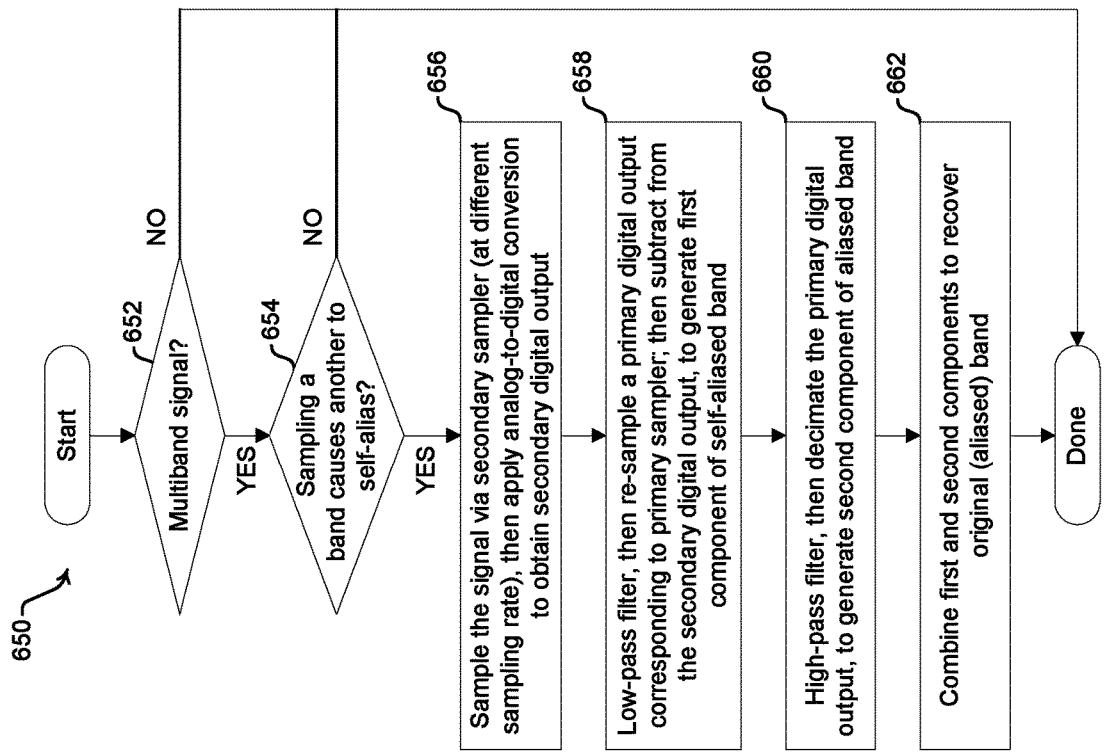
FIG. 6B is a flow chart that illustrates exemplary steps for performing secondary subsampling, in accordance with an embodiment of the invention.
Figure 6A:
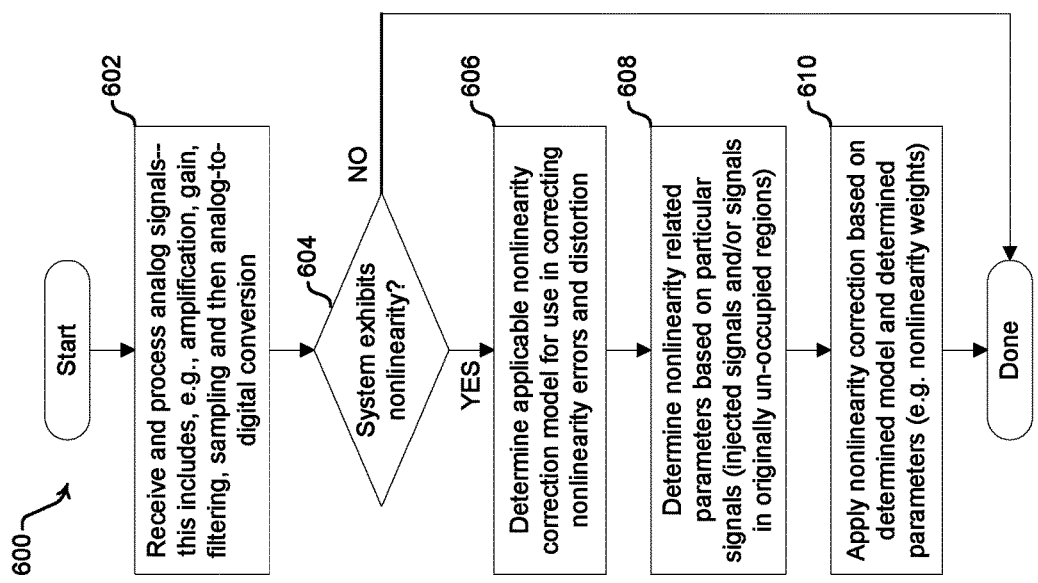
FIG. 6A is a flow chart that illustrates exemplary steps for performing nonlinearity correction and calibration, in accordance with an embodiment of the invention.

FIG. 6A is a flow chart that illustrates exemplary steps for performing nonlinearity correction and calibration, in accordance with an embodiment of the invention. Referring to FIG. 6A, there is shown a flow chart 600 comprising a plurality of exemplary steps that may be performed to enable nonlinearity correction and calibration during reception of analog signals, and performing of analog-to-digital conversion thereto, such as during broadband communications.

In step 602, an analog signal may be received and processed, such as via the analog front-end 200. In this regard, reception and handling of analog signals may comprise performing such operations as amplification, gain, and/or filtering operations, sampling, and then analog-to-digital conversion. In step 604, a determination whether the receiving system exhibits nonlinearity may be performed. In instances where the receiving system does not exhibit nonlinearity, the process may conclude. In instances where it is determined that the receiving system does exhibit nonlinearity, the process may proceed to step 606.

In step 606, applicable nonlinearity correction models, for use in correcting errors and distortion resulting from system's nonlinearity, may be determined. The nonlinearity correction model may be represented by equation (2) for example. In step 608, nonlinearity related parameters, which may be necessary for calibrating the applicable nonlinearity model, may be determined. The nonlinearity related parameters may comprise applicable nonlinearity weights in instances where the nonlinearity correction model is similar to the model according to equation (2). The nonlinearity related parameters may be determined and/or estimated based on particular signals. In this regard, the signals that are utilized in estimating the nonlinearity parameters may comprise injected signals having known characteristics and/or signals present in originally un-occupied regions. In step 610, nonlinearity correction may be applied based on the determined applicable nonlinearity correction model and estimated nonlinearity correction parameters (e.g. nonlinearity weights).

FIG. 6B is a flow chart that illustrates exemplary steps for performing secondary subsampling, in accordance with an embodiment of the invention. Referring to FIG. 6B, there is shown a flow chart 650 comprising a plurality of exemplary steps that may be performed to enable performing secondary subsampling of multi-band signals, such as during broadband communications.

In step 652, a determination of whether a received signal is a multi-band signal may be performed. In instances where the received signal is not a multi-band signal, the process may conclude. In instances where the received signal is determined to be a multi-band signal, the process may proceed to step 654. In step 654, a determination of whether sampling a particular band in the multi-band signal may cause another band to self-alias may be performed. In instances where no self-aliasing occurs, the process may conclude. In instances where it is determined that self-aliasing would occur, the process may proceed to step 656. In step 656, the input signal is sampled via secondary sampler, having a particular sampling rate to sample for the would-be self-aliased band, and the sampling output is then subjected to analog-to-digital conversion, to obtain the secondary digital output. In step 658, the primary digital output, corresponding to the analog-to-digital conversion of the output of the primary sampler utilized to sample the first band, may be low-pass filtered, and then re-sample; and the result may then be subtracted from the secondary digital output, to generate first component of self-aliased band. In step 660, primary digital output may be high-pass filtered, and then decimated, to generate first component of self-aliased band. In step 662, the first and second components may be combined to reconstruct the original (self-aliased) band.

Various embodiments of the invention may comprise a method and system for broadband analog to digital converter technology. The broadband receiver 102 may be configured to correct, via the digital corrector 202, nonlinearity associated with reception and/or handling of analog signals, such as nonlinearity associated with the analog front-end 200 during reception, handling, sampling, and/or analog-to-digital conversion of the received analog signals thereby. In this regard, the nonlinearity correction may be performed in accordance with a particular nonlinearity correction model, such as the model described by equation (2). The broadband receiver 102 may be configured to calibrate the nonlinearity correction, where the nonlinearity calibration may comprise generating and/or estimating, via the correction estimator 302 for example, correction estimation parameters, such as weights $\mu_i$, which when applied via the particular nonlinearity correction model, to total spectral content may reduce distortion resulting from the system's nonlinearity in originally-unoccupied spectral regions. The broadband receiver 102 may then correct, via the digital corrector 202, using the applicable nonlinearity correction model and the estimated correction estimation parameters, digital signals generated, by the analog front-end 200, based on sampling and/or conversion of the received analog signals. The broadband receiver 102 may be configured to perform the nonlinearity correction calibration during reception and handling of the analog signals.

The correction estimation parameters may be generated and/or estimated based on signals in particular spectral regions. In this regard, the particular spectral regions may correspond to the originally-unoccupied spectral regions (e.g. region 226). The nonlinearity correction calibration may comprise injecting specific signals, such as training signals generated by the training signal generator 300, in the particular spectral regions. The specific signals may have known characteristics (e.g., frequency, amplitude, phase, etc.). Accordingly, the generation and/or estimation of the correction estimation parameters, by the correction estimator 302, may be based on the injected specific signals. The nonlinearity correction calibration may comprise isolating, via the tone isolator 330 and/or the isolation filter 420, signals or content located in the particular spectral regions, wherein the correction estimation parameters may be generated and/or estimation may be performed based on that isolation. The isolating of signals and/or content located in the particular spectral regions may be performed before or after correcting the digital signals.

The broadband receiver 102 may also be configured to perform secondary subsampling, via a secondary subsampling path comprising the secondary subsampling module 550 and the signal reconstructor 552 for example, to enable acquiring a particular band, such as band B (504) of a multiband signal when the particular band is self-aliased during sampling of another, primary band of the multiband signal, such as band A (502). In this regard, acquiring and/or reconstructing the particular band during the secondary subsampling may comprise generating a plurality of components corresponding to the particular band, which may be generated based on analog-to-digital conversion of outputs of sampling of the particular band and sampling of the primary band, using the sampler 212, the ADC 216, and the secondary subsampling module 552; and combining the plurality of components to reconstruct the particular band, via the combiner 574 for example. Use of secondary subsampling may be optional, with that function being disabled, for example, when sampling of the primary band is determined to not cause self-aliasing of the particular band. During the secondary subsampling, a first component of the particular band may be generated based on high-pass filtering, via the HPF 570, and then decimating, via the decimator 572, of an output of analog-to-digital conversion of the output of the sampling of the primary band, corresponding to the output of ADC 216. A second component may be generated by low-pass filtering, via the LPF 562, and then re-sampling, via the re-sampler 564, of the output of analog-to-digital conversion of the output of the sampling of the primary band; and then subtracting, via the subtractor 566, the low-pass filtered and re-sampled output from an output of analog-to-digital conversion of the output of sampling of the particular band, corresponding to the output of ADC 576 of the secondary subsampling module 552 for example.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for broadband analog to digital converter technology.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system, comprising:
   one or more circuits for use in a signal receiver to reconstruct a first band in a received multiband signal, wherein the first band is self-aliased during sampling of a second band, the one or more circuits being operable to:
   generate a plurality of components corresponding to the first band based on the sampling of the second band; and combine the plurality of components to reconstruct the first band.

2. The system of claim 1, wherein the one or more circuits are operable to apply, when generating a first one of the plurality of components, high-pass filtering to an input corresponding to an output of the sampling of the second band.

3. The system of claim 1, wherein the one or more circuits are operable to apply, when generating a first one of the plurality of components, decimation to an input corresponding to an output of the sampling of the second band.

4. The system of claim 1, wherein the one or more circuits are operable to apply, when generating a second one of the plurality of components, low-pass filtering to an input corresponding to an output of the sampling of the second band.

5. The system of claim 1, wherein the one or more circuits are operable to apply, when generating a second one of the plurality of components, re-sampling to an input corresponding to an output of the sampling of the second band.

6. The system of claim 1, wherein the one or more circuits are operable to apply, when generating a second one of the plurality of components, an adjustment based on sampling of the first band.

7. The system of claim 6, wherein the adjustment comprises subtracting from an input corresponding to an output of the sampling of the first band, an input corresponding to intermediate output, during said generating said second one of the plurality of components.

8. The system of claim 1, wherein the one or more circuits are operable to disable reconstructing the first band when sampling of the second band does not cause self-aliasing of the first band.

9. A method, comprising:
in a signal receiver, during processing of a received multiband signal:
generating a plurality of components corresponding to a first band in the multiband signal, wherein:
the plurality of components is generated based on sampling of a second band, and
the first band is self-aliased due to the sampling of the second band; and
reconstructing the first band, without self-aliasing, based on combining of the plurality of components.

10. The method of claim 9, comprising applying, when generating a first one of the plurality of components, high-pass filtering to an input corresponding to an output of the sampling of the second band.

11. The method of claim 9, comprising applying, when generating a first one of the plurality of components, decimation to an input corresponding to an output of the sampling of the second band.

12. The method of claim 9, comprising applying, when generating a second one of the plurality of components, low-pass filtering to an input corresponding to an output of the sampling of the second band.

13. The method of claim 9, comprising applying, when generating a second one of the plurality of components, re-sampling to an input corresponding to an output of the sampling of the second band.

14. The method of claim 9, comprising applying, when generating a second one of the plurality of components, an adjustment based on sampling of the first band.

15. The method of claim 14, wherein the adjustment comprises subtracting from an input corresponding to an output of the sampling of the first band, an input corresponding to intermediate output, during said generating said second one of the plurality of components.

16. The method of claim 9, comprising disabling reconstructing the first band when sampling of the second band does not cause self-aliasing of the first band.

17. A system, comprising:
a signal reconstruction component that comprises:
a plurality of component processing paths, wherein:
each of the plurality of processing paths is operable to generate a respective one of a plurality of a plurality of components corresponding to a first band in a multiband signal,
the plurality of components is generated based on sampling of a second band in the multiband signal, and
the first band is self-aliased due to the sampling of the second band; and
a combiner that is operable to combine the plurality of components to reconstruct the first band.

18. The system of claim 17, wherein a first one of the plurality of component processing paths comprises:
a high-pass filter circuit that is operable to apply high-pass filtering to an input corresponding to an output of the sampling of the second band; and
a decimator circuit that is operable to apply decimation to an input corresponding to an output of the high-pass filter circuit.

19. The system of claim 17, wherein a second one of the plurality of component processing paths comprises:
a low-pass filter circuit that is operable to apply low-pass filtering to an input corresponding to an output of the sampling of the second band; and
a re-sampler circuit that is operable to apply re-sampling to an input corresponding to an output of the low-pass filter circuit.

20. The system of claim 19, wherein the second one of the plurality of component processing paths comprises a subtractor circuit that is operable to subtract an input corresponding to output of said re-sampler circuit from an input corresponding to an output of sampling of the first band.

* * * * *